United States Patent
Kitazawa et al.

(10) Patent No.: US 10,643,869 B2
(45) Date of Patent: May 5, 2020

(54) LIGHT IRRADIATION TYPE HEAT TREATMENT APPARATUS AND HEAT TREATMENT METHOD

(71) Applicant: SCREEN HOLDINGS CO., LTD., Kyoto (JP)

(72) Inventors: Takahiro Kitazawa, Kyoto (JP); Kazuhiko Fuse, Kyoto (JP)

(73) Assignee: SCREEN HOLDINGS CO., LTD., Kyoto (JP)

(*) Notice: Subject to any disclaimer, the term of this patent is extended or adjusted under 35 U.S.C. 154(b) by 197 days.

(21) Appl. No.: 15/868,668

(22) Filed: Jan. 11, 2018

(65) Prior Publication Data
US 2018/0240689 A1 Aug. 23, 2018

(30) Foreign Application Priority Data

Feb. 21, 2017 (JP) .................................. 2017-029988

(51) Int. Cl.
*H01L 21/67* (2006.01)
*H01L 21/687* (2006.01)
(Continued)

(52) U.S. Cl.
CPC .. *H01L 21/67115* (2013.01); *H01L 21/67248* (2013.01); *H01L 21/67288* (2013.01);
(Continued)

(58) Field of Classification Search
CPC ......... H01L 21/67115; H01L 21/67288; H01L 21/68707; H01L 21/681; H01L 21/67248;
(Continued)

(56) References Cited

U.S. PATENT DOCUMENTS 6,552,775 B1 * 4/2003 Yanagihara ......... G03F 7/70225
250/492.2
7,230,709 B2 * 6/2007 Kusuda .................. G01N 21/31
219/405
(Continued)

FOREIGN PATENT DOCUMENTS

JP 2012-238779 A 12/2012
JP 2012-238782 A 12/2012
(Continued)

OTHER PUBLICATIONS

Korean Decision to Grant a Patent issued in corresponding Korean Patent Application No. 10-2018-0005558, dated Jun. 17, 2019, with English Translation.
(Continued)

*Primary Examiner* — Bac H Au
(74) *Attorney, Agent, or Firm* — McDermott Will & Emery LLP

(57) ABSTRACT

A semiconductor wafer that has a plane orientation of (100) and is made of monocrystalline silicon is warped along an axis, i.e., a diameter along a <100> direction of the semiconductor wafer when irradiated with a flash of light. The semiconductor wafer is placed on a susceptor while the direction of the semiconductor wafer is adjusted so that the diameter along the <100> direction coincides with an optical axis of an upper radiation thermometer. This adjustment makes a diameter along a direction in which a warp of the semiconductor wafer is smallest during irradiation with a flash of light coincide with the optical axis of the upper radiation thermometer. As a result, the semiconductor wafer is hardly warped along the optical axis direction of the upper radiation thermometer even during irradiation with a flash of light, thus hardly changing the emissivity of the semicon-
(Continued)

ductor wafer, so that it is possible to accurately measure the temperature of an upper surface of the semiconductor wafer.

4 Claims, 14 Drawing Sheets

(51) Int. Cl.
  *H01L 21/66* (2006.01)
  *H01L 21/68* (2006.01)
  *H01L 21/225* (2006.01)
  *H01L 21/268* (2006.01)

(52) U.S. Cl.
  CPC ........ *H01L 21/681* (2013.01); *H01L 21/6875* (2013.01); *H01L 21/68707* (2013.01); *H01L 21/68785* (2013.01); *H01L 22/26* (2013.01); H01L 21/2253 (2013.01); H01L 21/2686 (2013.01); H01L 22/10 (2013.01)

(58) Field of Classification Search
  CPC ........... H01L 21/6875; H01L 21/68785; H01L 22/26; H01L 22/10; H01L 21/2686; H01L 21/2253
  See application file for complete search history.

(56) References Cited

U.S. PATENT DOCUMENTS

| | | | |
|---|---|---|---|
| 2005/0140960 A1* | 6/2005 | Andreas Hazenberg | G03F 7/7075 355/72 |
| 2008/0045030 A1* | 2/2008 | Tahara | H01L 21/02063 438/715 |
| 2008/0260938 A1* | 10/2008 | Ikeda | C23C 14/042 427/66 |
| 2010/0168889 A1* | 7/2010 | Sekido | H01J 37/32431 700/97 |
| 2012/0288261 A1 | 11/2012 | Hashimoto et al. | |
| 2012/0288970 A1* | 11/2012 | Hashimoto | H01L 21/67115 438/16 |
| 2015/0276388 A1 | 10/2015 | Akita et al. | |
| 2016/0079085 A1 | 3/2016 | Aoyama et al. | |
| 2017/0347398 A1 | 11/2017 | Aoyama et al. | |

FOREIGN PATENT DOCUMENTS

| | | |
|---|---|---|
| JP | 2015-065358 A | 4/2015 |
| KR | 10-2015-0112887 A | 10/2015 |
| TW | 201342511 A | 10/2013 |
| TW | 201614719 A | 4/2016 |

OTHER PUBLICATIONS

Taiwanese Office Action issued in corresponding Taiwanese Patent Application No. 106138938, dated Jul. 3, 2018, with English Translation of the Japanese Translation of the Taiwanese Office Action.

* cited by examiner

F I G. 6
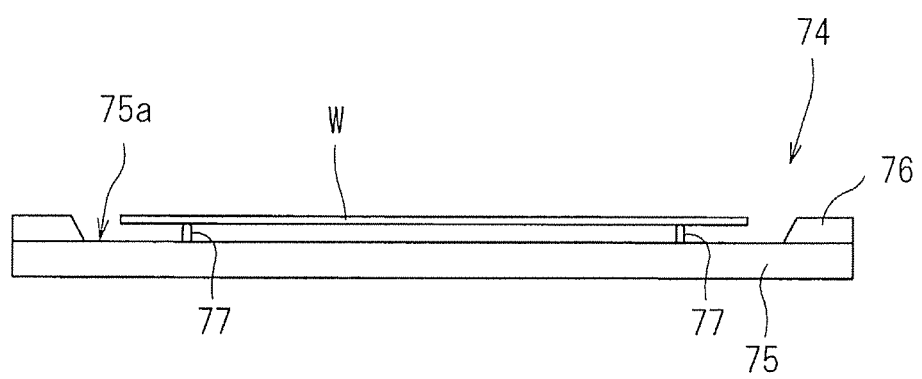

F I G . 1 1
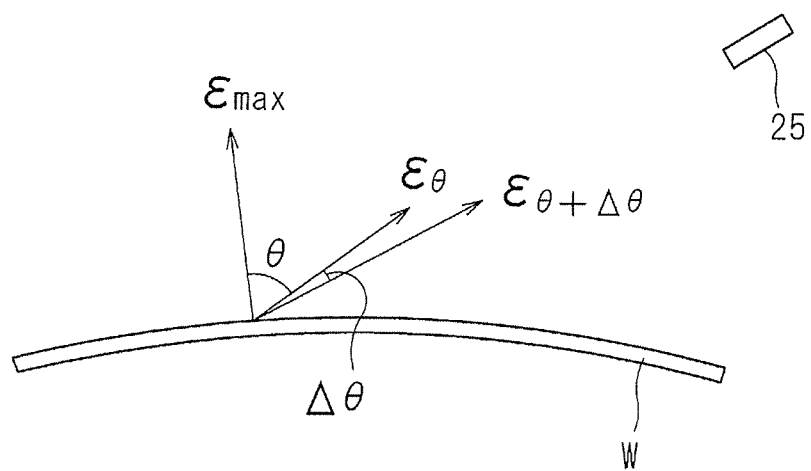

F I G . 1 2
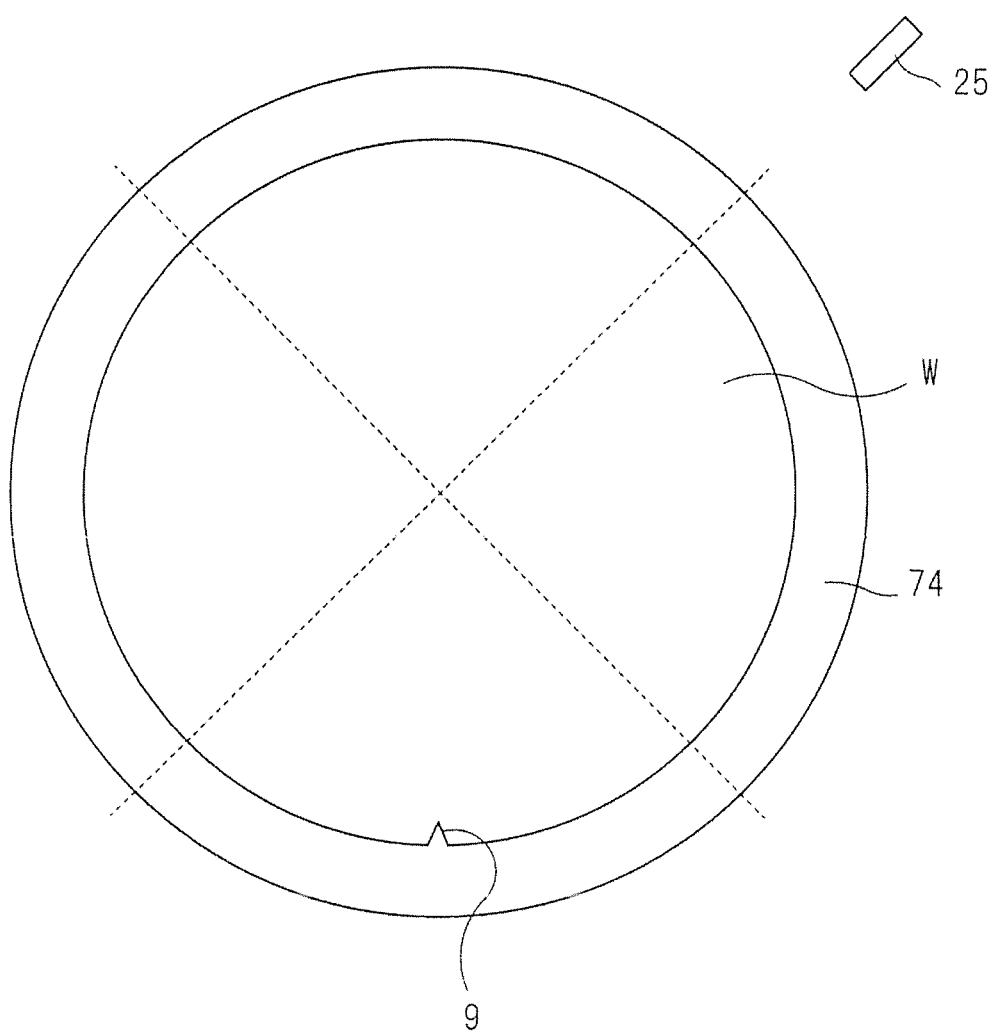

F I G. 1 4
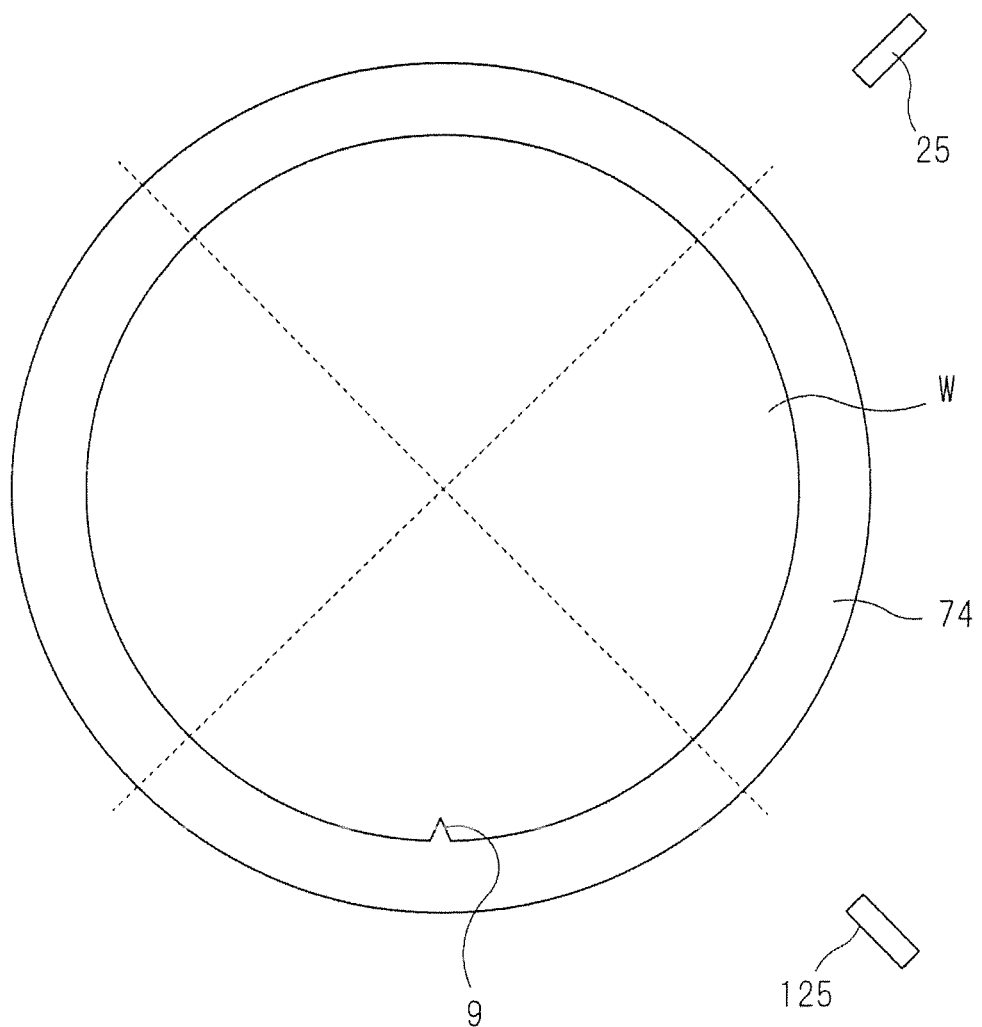

LIGHT IRRADIATION TYPE HEAT TREATMENT APPARATUS AND HEAT TREATMENT METHOD

BACKGROUND OF THE INVENTION

Field of the Invention

The present invention relates to a heat treatment apparatus for irradiating with a flash of light a thin plate-shaped precision electronic substrate (hereinafter, simply referred to as a "substrate") such as a disk-shaped semiconductor wafer to heat the substrate, and to a heat treatment method.

Description of the Background Art

In a process of manufacturing a semiconductor device, impurity introduction is an essential step of forming a pn junction in a semiconductor wafer. At present, an impurity is generally introduced by an ion implantation method and a subsequent annealing method. The ion implantation method is a technique of physically injecting an impurity by ionizing an impurity element such as boron (B), arsenic (As), and phosphorus (P) and making the impurity ion collide with a semiconductor wafer at a highly accelerated voltage. The injected impurity is activated by an annealing process. In the annealing process, an annealing time period of several seconds or more causes deep diffusion of the implanted impurity by heat, resulting in a junction that is much deeper than is necessary to possibly cause an obstacle to favorable formation of a device.

Thus, as an annealing technique of heating a semiconductor wafer within an extremely short time period, flash lamp annealing (FLA) has attracted attention in recent years. The flash lamp annealing is a heat treatment technique of irradiating a surface of a semiconductor wafer, in which an impurity has been injected, with a flash of light using a xenon flash lamp (hereinafter, the simple term "flash lamp" means a xenon flash lamp) to increase the temperature of only the surface of the semiconductor wafer within an extremely short time period (several milliseconds or less).

The spectral distribution of light emitted from a xenon flash lamp ranges from an ultraviolet region to a near-infrared region that is a shorter wavelength than the wavelength of light from a conventional halogen lamp, and nearly coincides with a base absorption band of a silicon semiconductor wafer. Therefore, irradiation of the semiconductor wafer with a flash of light from the xenon flash lamp can produce less transmitted light to rapidly increase the temperature of the semiconductor wafer. In addition, it has become known that irradiation with a flash of light within an extremely short time period of several milliseconds or less can selectively increase the temperature of only the vicinity of a surface of the semiconductor wafer. Thus, the xenon flash lamp can increase the temperature of the semiconductor wafer within an extremely short time period to activate an impurity without deeply diffusing the impurity.

In the heat treatment of a semiconductor wafer, the significance of managing the temperature of the wafer is not unique to the flash lamp annealing. US2012/0288970 and US2012/0288261 disclose a technique of providing a radiation thermometer diagonally above a semiconductor wafer to be treated and making the radiation thermometer receive radiation emitted from a surface of the semiconductor wafer to measure the temperature of the surface.

It has been known, however, that in a flash lamp annealer, a front surface of a semiconductor wafer is instantaneously irradiated with a flash of light having extremely high energy, so that the temperature of the front surface of the semiconductor wafer rapidly increases in an instant, causing sudden thermal expansion on the front surface of the wafer to deform the semiconductor wafer in a warped form. Such a warp of the semiconductor wafer during irradiation with a flash of light has caused a problem of generating an error in temperature measurement with a radiation thermometer.

SUMMARY

The present invention is intended for a heat treatment apparatus for irradiating a disk-shaped substrate with a flash of light to heat the substrate.

According to one aspect of the present invention, a heat treatment apparatus includes: an alignment mechanism for adjusting a direction of a substrate; a chamber for receiving the substrate therein and heat-treating the substrate; a susceptor which is disposed in the chamber and on which the substrate is placed and held; a transport part for transporting the substrate from the alignment mechanism to the susceptor in the chamber; a flash lamp that is provided over the chamber and irradiates with a flash of light an upper surface of the substrate placed on the susceptor; and a radiation thermometer that is disposed diagonally above the substrate placed on the susceptor and receives infrared radiation emitted from an upper surface of the substrate to measure a temperature of the upper surface, the alignment mechanism adjusting the direction of the substrate so that a diameter along a direction in which a warp of the substrate is smallest coincides with an optical axis of the radiation thermometer when the flash lamp emits a flash of light.

Even when the substrate is warped by irradiation with a flash of light, the substrate is hardly warped along the optical axis direction of the radiation thermometer, thus hardly changing the emissivity of the substrate, so that it is possible to accurately measure the temperature of the upper surface of the substrate.

According to another aspect of the present invention, a heat treatment apparatus includes: an alignment mechanism for adjusting a direction of a substrate; a chamber for receiving the substrate therein and heat-treating the substrate; a susceptor which is disposed in the chamber and on which the substrate is placed and held; a transport part for transporting the substrate from the alignment mechanism to the susceptor in the chamber; a flash lamp that is provided over the chamber and irradiates with a flash of light an upper surface of the substrate placed on the susceptor; and a radiation thermometer that is disposed diagonally above the substrate placed on the susceptor and receives infrared radiation emitted from an upper surface of the substrate to measure a temperature of the upper surface, the substrate being a semiconductor wafer that has a plane orientation of (100) and is made of monocrystalline silicon, and the alignment mechanism adjusting the direction of the substrate so that a bisector of an angle between two diameters along a <100> direction of the substrate coincides with an optical axis of the radiation thermometer.

Even when the substrate is warped by irradiation with a flash of light, the warp of the substrate can be suppressed along the optical axis direction of the radiation thermometer, so that it is possible to accurately measure the temperature of the upper surface of the substrate.

According to another aspect of the present invention, a heat treatment apparatus includes: an alignment mechanism for adjusting a direction of a substrate; a chamber for receiving the substrate therein and heat-treating the substrate; a susceptor which is disposed in the chamber and on which the substrate is placed and held; a transport part for transporting the substrate from the alignment mechanism to the susceptor in the chamber; a flash lamp that is provided over the chamber and irradiates with a flash of light an upper surface of the substrate placed on the susceptor; a first radiation thermometer that is disposed diagonally above the substrate placed on the susceptor and receives infrared radiation emitted from an upper surface of the substrate to measure a temperature of the upper surface; and a second radiation thermometer that is disposed diagonally above the substrate and separated from the first radiation thermometer by 90° with a center of the substrate viewed as a vertex and that receives infrared radiation emitted from an upper surface of the substrate to measure a temperature of the upper surface, the substrate being a semiconductor wafer having a plane orientation of (100) and is made of monocrystalline silicon, and the alignment mechanism adjusting the direction of the substrate so that two diameters along a <100> direction of the substrate coincide with optical axes of the first radiation thermometer and the second radiation thermometer.

Even when the substrate is warped by irradiation with a flash of light, the substrate is hardly warped along the optical axis direction of either the first radiation thermometer or the second radiation thermometer, thus hardly changing the emissivity of the substrate, so that it is possible to accurately measure the temperature of the upper surface of the substrate.

The present invention is also intended for a heat treatment method of irradiating a disk-shaped substrate with a flash of light to heat the substrate.

According to one aspect of the present invention, a heat treatment method includes the steps of: (a) placing and holding a substrate on a susceptor disposed in a chamber; (b) irradiating an upper surface of the substrate placed on the susceptor with a flash of light from a flash lamp provided over the chamber; and (c) receiving infrared radiation emitted from an upper surface of the substrate to measure a temperature of the upper surface by a radiation thermometer disposed diagonally above the substrate placed on the susceptor, the substrate being placed on the susceptor in the step (a) so that a diameter along a direction in which a warp of the substrate is smallest coincides with an optical axis of the radiation thermometer when a flash of light is emitted in the step (b).

Even when the substrate is warped by irradiation with a flash of light, the substrate is hardly warped along the optical axis direction of the radiation thermometer, thus hardly changing the emissivity of the substrate, so that it is possible to accurately measure the temperature of the upper surface of the substrate.

According to another aspect of the present invention, a heat treatment method includes the steps of: (a) placing and holding a substrate on a susceptor disposed in a chamber; (b) irradiating an upper surface of the substrate placed on the susceptor with a flash of light from a flash lamp provided over the chamber; and (c) receiving infrared radiation emitted from an upper surface of the substrate to measure a temperature of the upper surface by a radiation thermometer disposed diagonally above the substrate placed on the susceptor, the substrate being a semiconductor wafer that has a plane orientation of (100) and is made of monocrystalline silicon, and the substrate being placed on the susceptor in the step (a) so that a bisector of an angle between two diameters along a <100> direction of the substrate coincides with an optical axis of the radiation thermometer.

Even when the substrate is warped by irradiation with a flash of light, the warp of the substrate can be suppressed along the optical axis direction of the radiation thermometer, so that it is possible to accurately measure the temperature of the upper surface of the substrate.

According to another aspect of the present invention, a heat treatment method includes the steps of: (a) placing and holding a substrate on a susceptor disposed in a chamber; (b) irradiating an upper surface of the substrate placed on the susceptor with a flash of light from a flash lamp provided over the chamber; and (c) receiving infrared radiation emitted from an upper surface of the substrate to measure a temperature of the upper surface by a first radiation thermometer disposed diagonally above the substrate placed on the susceptor, or a second radiation thermometer that is disposed diagonally above the substrate and separated from the first radiation thermometer by 90° with a center of the substrate viewed as a vertex, the substrate being a semiconductor wafer that has a plane orientation of (100) and is made of monocrystalline silicon, and the substrate being placed on the susceptor in the step (a) so that two diameters along a <100> direction of the substrate coincide with optical axes of the first radiation thermometer and the second radiation thermometer.

Even when the substrate is warped by irradiation with a flash of light, the substrate is hardly warped along the optical axis direction of either the first radiation thermometer or the second radiation thermometer, thus hardly changing the emissivity of the substrate, so that it is possible to accurately measure the temperature of the upper surface of the substrate.

Thus, an object of the present invention is to accurately measure the temperature of an upper surface of a substrate even when the substrate is warped by irradiation with a flash of light.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a sectional view of the susceptor;

FIG. 11 is a view showing a change in emissivity when a semiconductor wafer is warped;

FIG. 12 is a view for illustrating a direction of a semiconductor wafer placed on the susceptor;

FIG. 14 is a view for illustrating adjustment of the direction of a semiconductor wafer in a third preferred embodiment.

DESCRIPTION OF THE PREFERRED EMBODIMENTS

Preferred embodiments according to the present invention will now be described in detail with reference to drawings.

First Preferred Embodiment

Figure 1:
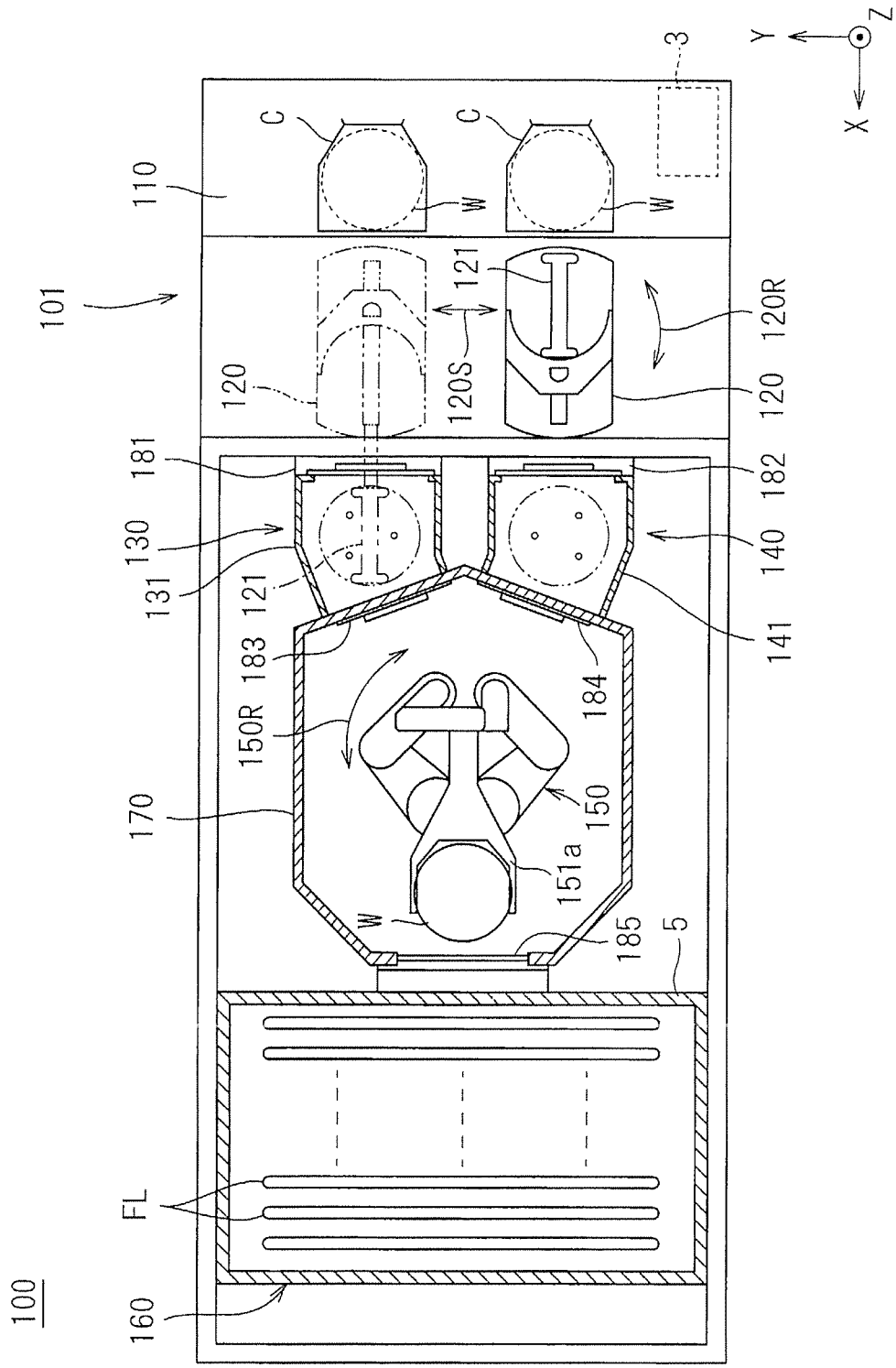
FIG. 1 is a plan view showing a heat treatment apparatus according to the present invention.
Figure 2:
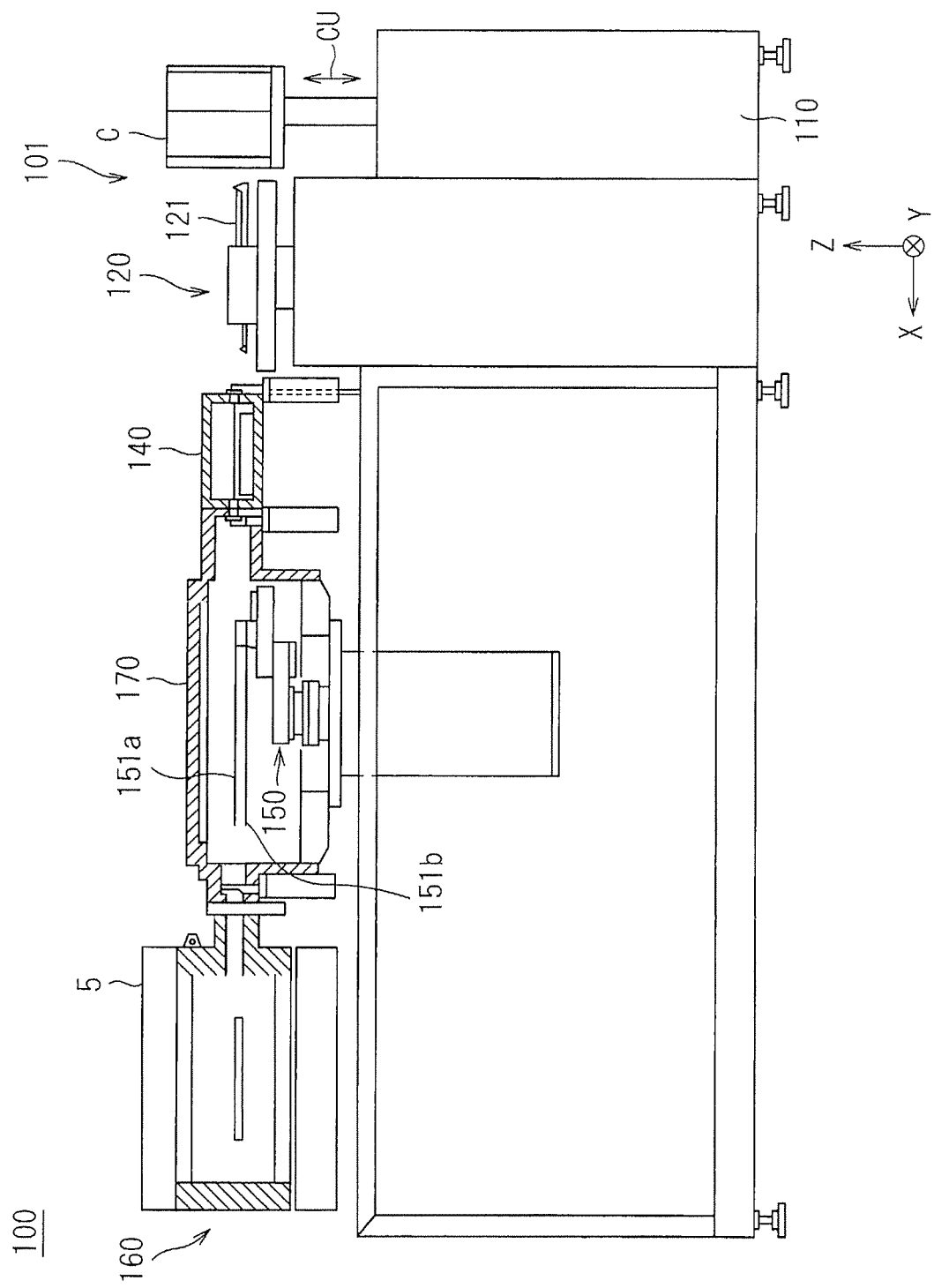
FIG. 2 is a front view of the heat treatment apparatus in FIG. 1.

First, a heat treatment apparatus 100 according to the present invention will be briefly described in terms of an entire schematic configuration. FIG. 1 is a plan view showing the heat treatment apparatus 100 according to the present invention, and FIG. 2 is a front view of the heat treatment apparatus. The heat treatment apparatus 100 is a flash lamp annealer for irradiating a disk-shaped semiconductor wafer W serving as a substrate with flashes of light to heat the semiconductor wafer W. The size of the semiconductor wafer W to be treated is not particularly limited, and the semiconductor wafer W to be treated has a diameter of, for example, 300 mm or 450 mm. The semiconductor wafer has an impurity injected therein before transported into the heat treatment apparatus 100, and the heat treatment apparatus 100 activates the injected impurity by a heat treatment. It should be noted that the dimensions and the number of components are shown in exaggeration or in a simplified form, as appropriate, in FIG. 1 and the subsequent drawings for the sake of easier understanding. It should also be noted that FIGS. 1 and 2 and the subsequent drawings have, as appropriate, an XYZ rectangular coordinate system in which a Z axis direction denotes a vertical direction and an XY plane denotes a horizontal plane, for clarifying a directional relationship among the components.

As shown in FIGS. 1 and 2, the heat treatment apparatus 100 includes an indexer 101 for transporting an untreated semiconductor wafer W from the outside into the apparatus and transporting a treated semiconductor wafer W out of the apparatus, an alignment part 130 for positioning an untreated semiconductor wafer W, a cooler 140 for cooling a heat-treated semiconductor wafer W, a flash heating part 160 for flash-heating a semiconductor wafer W, and a transport robot 150 for transporting a semiconductor wafer W into and out of the alignment part 130, the cooler 140, and the flash heating part 160. The heat treatment apparatus 100 also includes a controller 3 for controlling operating mechanisms provided in the above-described processing parts and the transport robot 150 to carry out a flash heat treatment of a semiconductor wafer W.

The indexer 101 includes a load port 110 having therein a plurality of carriers C (in the present preferred embodiment, two) arranged next to each other, and a transfer robot 120 for extracting an untreated semiconductor wafer W from each of the carriers C and loading a treated semiconductor wafer W into each of the carriers C. The carrier C having received an untreated semiconductor wafer W therein is transported by, for example, an unmanned transport vehicle (AGV, OHT) and placed on the load port 110, whereas the carrier C having received a treated semiconductor wafer W therein is taken away from the load port 110 by an unmanned transport vehicle. In the load port 110, the carrier C is configured to be capable of moving up and down as shown by the arrow CU in FIG. 2 so that the transfer robot 120 can load and extract any semiconductor wafer W into and from the carrier C. The form of the carrier C may be, in addition to a FOUP (Front Opening Unified Pod) that houses a semiconductor wafer W in an enclosed space, an SMIF (Standard Mechanical Inter Face) pod or an OC (Open Cassette) that exposes a housed semiconductor wafer W in open air.

The transfer robot 120 allows a sliding movement as shown by the arrow 120S in FIG. 1, a rotating motion as shown by the arrow 120R in FIG. 1, and an elevating motion. These movement and motions enable the transfer robot 120 to load and extract a semiconductor wafer W into and from each of the two carriers C and to transfer a semiconductor wafer W to and from the alignment part 130 and the cooler 140. The transfer robot 120 loads and extracts a semiconductor wafer W into and from the carrier C by a slide movement of a hand 121 and an elevation movement of the carrier C. In addition, the transfer robot 120 transfers a semiconductor wafer W to and from the alignment part 130 or the cooler 140 by a slide movement of the hand 121 and an elevation motion of the transfer robot 120.

The alignment part 130 is a processing part for rotating a semiconductor wafer W within a horizontal plane to appropriately direct the semiconductor wafer W for flash heating subsequently performed. The alignment part 130 is configured to include, for example, an alignment chamber 131 serving as an aluminum alloy-made enclosure, a mechanism for supporting and rotating a semiconductor wafer W in a horizontal attitude, and a mechanism for optically detecting a notch, an orientation flat, or the like formed in a periphery portion of a semiconductor wafer W, both the mechanisms being provided in the alignment chamber 131. The transfer robot 120 transfers a semiconductor wafer W to the alignment chamber 131 so that the center of the wafer is positioned at a predetermined position. The alignment part 130 rotates around a vertical axis a semiconductor wafer W received from the indexer 101 with a central portion of the semiconductor wafer W as a rotational center and optically detects a notch or the like to adjust the direction of the semiconductor wafer W.

A main portion of the heat treatment apparatus 100, namely, the flash heating part 160 is a substrate treatment part for irradiating a preheated semiconductor wafer W with glints of light (flashes of light) from xenon flash lamps FL to flash-heat the semiconductor wafer W. The flash heating part 160 is further described in detail below.

The cooler 140 is configured to include a cooling chamber 141 serving as an aluminum alloy-made enclosure, a metal-made cooling plate provided in the cooling chamber 141, and a quartz plate provided in the cooling chamber and placed on an upper surface of the cooling plate. A semiconductor wafer W that has been just flash-heated in the flash heating part 160 and thus has a high temperature is placed on the quartz plate in the cooler 140 for cooling.

The transport robot 150 is capable of rotating around a vertical axis as shown by the arrow 150R and includes two linkage mechanisms formed of a plurality of arm segments, the two linkage mechanisms having on distal ends thereof upper and lower transport hands 151a and 151b for holding a semiconductor wafer W. The upper and lower transport hands 151a and 151b are disposed while being longitudinally separated from each other at a predetermined pitch, and are, owing to the linkage mechanisms, capable of linearly sliding independently in the identical horizontal direction. In addition, the transport robot 150 moves up and down a base, on which the two linkage mechanisms are provided, to move up and down the two upper and lower transport hands 151a and 151b while keeping the hands separated from each other at the predetermined pitch.

Further provided is a transport chamber 170 that serves as a transport space allowing transportation of a semiconductor wafer W by the transport robot 150 and houses the transport robot 150 therein, and the transport chamber 170 is disposed in connection with the alignment chamber 131, the cooling chamber 141, and a process chamber 6 of the flash heating part 160. When transferring (loading and extracting) a semiconductor wafer W to or from a target, namely, the alignment chamber 131, the cooling chamber 141, or the process chamber 6 of the flash heating part 160, the transport robot 150 rotates so that both the upper and lower transport hands 151a and 151b are opposed to the target, and then (or while rotating) moves up or down to locate either one of the transport hands to a height at which the transport hand transfers the semiconductor wafer W to or from the target. Subsequently, the transport robot 150 linearly slides the upper transport hand 151a (lower transport hand 151b) in the horizontal direction to transfer the semiconductor wafer W to or from the target.

Gate valves 181 and 182 are provided between the alignment chamber 131 of the alignment part 130 and the indexer 101 and between the cooling chamber 141 of the cooler 140 and the indexer 101, respectively. Further, gate valves 183, 184, and 185 are provided between the transport chamber 170 and the alignment chamber 131, between the transport chamber 170 and the cooling chamber 141, and between the transport chamber 170 and the process chamber 6 of the flash heating part 160, respectively. These gate valves are appropriately opened and closed when a semiconductor wafer W is transported in the heat treatment apparatus 100. In the meantime, a highly pure nitrogen gas is supplied from a nitrogen gas supply part (not shown) to the alignment chamber 131, the cooling chamber 141, and the transport chamber 170 to keep the inside of the chambers clean, and an excess of the nitrogen gas is appropriately exhausted from an exhaust pipe.

Figure 3:
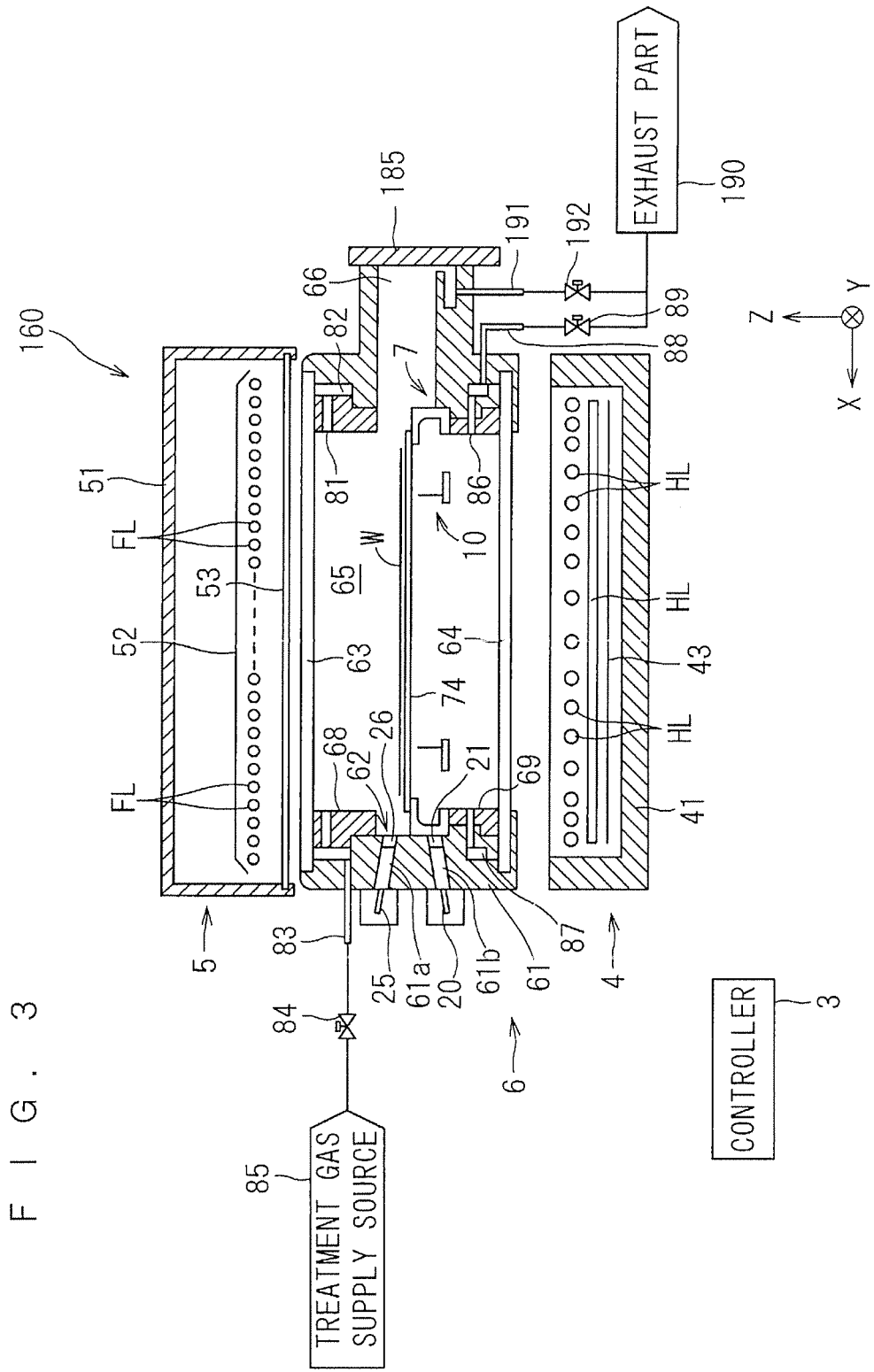
FIG. 3 is a longitudinal sectional view showing a configuration of a flash heating part.

Next, a configuration of the flash heating part 160 will be described. FIG. 3 is a longitudinal sectional view showing the configuration of the flash heating part 160. The flash heating part 160 includes the process chamber 6 for receiving a semiconductor wafer W therein and heat-treating the semiconductor wafer W, a flash lamp house 5 including a plurality of built-in flash lamps FL, and a halogen lamp house 4 including a plurality of built-in halogen lamps HL. The flash lamp house 5 is provided over the process chamber 6, and the halogen lamp house 4 is provided under the process chamber 6. The flash heating part 160 also includes, inside the process chamber 6, a holder 7 for holding a semiconductor wafer W in a horizontal attitude, and a transfer mechanism 10 for transferring a semiconductor wafer W between the holder 7 and the transport robot 150.

The process chamber 6 is configured such that upper and lower chamber windows 63 and 64 made of quartz are mounted to the top and the bottom, respectively, of a tubular chamber side portion 61. The chamber side portion 61 has a substantially tubular shape having a top opening and a bottom opening. The upper chamber window 63 is mounted to block the top opening of the chamber side portion 61, and the lower chamber window 64 is mounted to block the bottom opening of the chamber side portion 61. The upper chamber window 63 forming a ceiling of the process chamber 6 is a disk-shaped member made of quartz and functions as a quartz window that transmits flashes of light emitted from the flash lamps FL therethrough into the process chamber 6. The lower chamber window 64 forming a floor of the process chamber 6 is also a disk-shaped member made of quartz and functions as a quartz window that transmits light emitted from the halogen lamps HL therethrough into the process chamber 6.

An upper reflective ring 68 is mounted to an upper portion of an inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted, by being inserted from the bottom of the chamber side portion 61 and fastened with screws not shown. That is, the upper and lower reflective rings 68 and 69 are removably mounted to the chamber side portion 61. An interior space of the process chamber 6, specifically, a space surrounded by the upper chamber window 63, the lower chamber window 64, the chamber side portion 61, and the upper and lower reflective rings 68 and 69 is defined as a heat treatment space 65.

A recessed portion 62 is defined in an inner wall surface of the process chamber 6 by mounting the upper and lower reflective rings 68 and 69 to the chamber side portion 61. That is, the recessed portion 62 is defined which is surrounded by a middle portion of the inner wall surface of the chamber side portion 61 where the upper and lower reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the process chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for transporting a semiconductor wafer W therethrough into and out of the process chamber 6. The transport opening 66 is openable and closable by the gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the process chamber 6 is an enclosed space.

The chamber side portion 61 is also provided with a through hole 61a for guiding therethrough infrared radiation emitted from an upper surface of a semiconductor wafer W to an upper radiation thermometer 25 to be described later, and a through hole 61b for guiding therethrough infrared radiation emitted from a lower surface of a semiconductor wafer W held by a susceptor 74 to be described later to a lower radiation thermometer 20. A transparent window 26 is mounted to the through hole 61a at a position on a heat treatment space 65 side, the transparent window 26 being made of a calcium fluoride material that transmits therethrough infrared radiation in a wavelength range measurable by the upper radiation thermometer 25. Further, a transparent window 21 is mounted to the through hole 61b at a position on a heat treatment space 65 side, the transparent window 21 being made of a barium fluoride material that transmits therethrough infrared radiation in a wavelength range measurable by the lower radiation thermometer 20.

A gas supply opening 81 for supplying a treatment gas into the heat treatment space 65 is provided in an upper portion of an inner wall of the process chamber 6. The gas supply opening 81 is provided above the recessed portion 62 and may be provided in the upper reflective ring 68. The gas supply opening 81 is connected in communication with a gas supply pipe 83 through a buffer space 82 provided in the form of an annular ring inside a side wall of the process chamber 6. The gas supply pipe 83 is connected to a treatment gas supply source 85. A valve 84 is inserted at some midpoint in the gas supply pipe 83. When the valve 84 is opened, a treatment gas is fed from the treatment gas supply source 85 to the buffer space 82. The treatment gas having flowed into the buffer space 82 flows in a spreading manner within the buffer space 82 which is lower in fluid resistance than the gas supply opening 81, and is supplied through the gas supply opening 81 into the heat treatment space 65. Examples of the treatment gas usable herein include inert gases such as nitrogen ($N_2$) and reactive gases such as hydrogen ($H_2$) and ammonia ($NH_3$) (in the present preferred embodiment, nitrogen).

On the other hand, a gas exhaust opening 86 for exhausting a gas from the heat treatment space 65 is provided in a lower portion of the inner wall of the process chamber 6. The gas exhaust opening 86 is provided below the recessed portion 62 and may be provided in the lower reflective ring 69. The gas exhaust opening 86 is connected in communication with a gas exhaust pipe 88 through a buffer space 87 provided in the form of an annular ring inside the side wall of the process chamber 6. The gas exhaust pipe 88 is connected to an exhaust part 190. A valve 89 is inserted at some midpoint in the gas exhaust pipe 88. When the valve 89 is opened, a gas in the heat treatment space 65 is exhausted from the gas exhaust opening 86 through the buffer space 87 to the gas exhaust pipe 88. A plurality of gas supply openings 81 and gas exhaust openings 86 may be arranged respectively in a circumferential direction of the process chamber 6 and may be in the form of a slit. The treatment gas supply source 85 and the exhaust part 190 may be mechanisms provided in the heat treatment apparatus 100 or utility systems in a factory in which the heat treatment apparatus 100 is installed.

A gas exhaust pipe 191 for exhausting a gas from the heat treatment space 65 is connected to a distal end of the transport opening 66. The gas exhaust pipe 191 is connected through a valve 192 to the exhaust part 190. By opening the valve 192, a gas in the process chamber 6 is exhausted through the transport opening 66.

Figure 4:
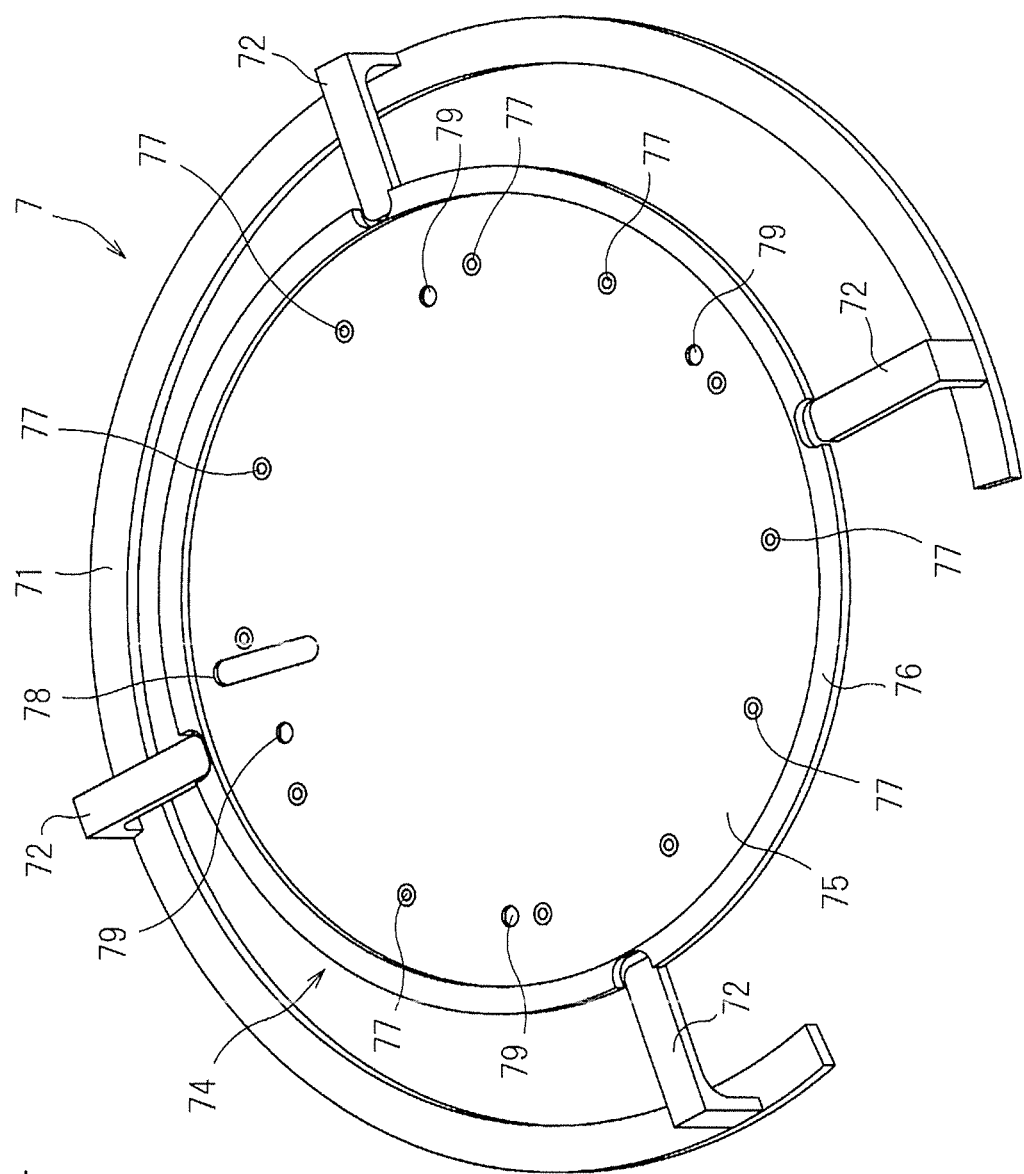
FIG. 4 is a perspective view showing an entire external appearance of a holder.

FIG. 4 is a perspective view showing the entire external appearance of the holder 7. The holder 7 is configured to include a base ring 71, a plurality of coupling portions 72, and the susceptor 74. The base ring 71, the coupling portions 72, and the susceptor 74 are all made of quartz. That is, the whole of the holder 7 is made of quartz.

The base ring 71 is a quartz member having an arcuate shape obtained by removing a portion from an annular ring shape. This removed portion is provided to prevent interference between two transfer arms 11 of the transfer mechanism 10 to be described later and the base ring 71. The base ring 71 is supported by the wall surface of the process chamber 6 by being placed on a bottom surface of the recessed portion 62 (See FIG. 3). The plurality of coupling portions 72 (in the present preferred embodiment, four) are provided upright on an upper surface of the base ring 71 and arranged in a circumferential direction of the annular ring shape of the base ring 71. The coupling portions 72 are also quartz members and are rigidly secured to the base ring 71 by welding.

Figure 5:
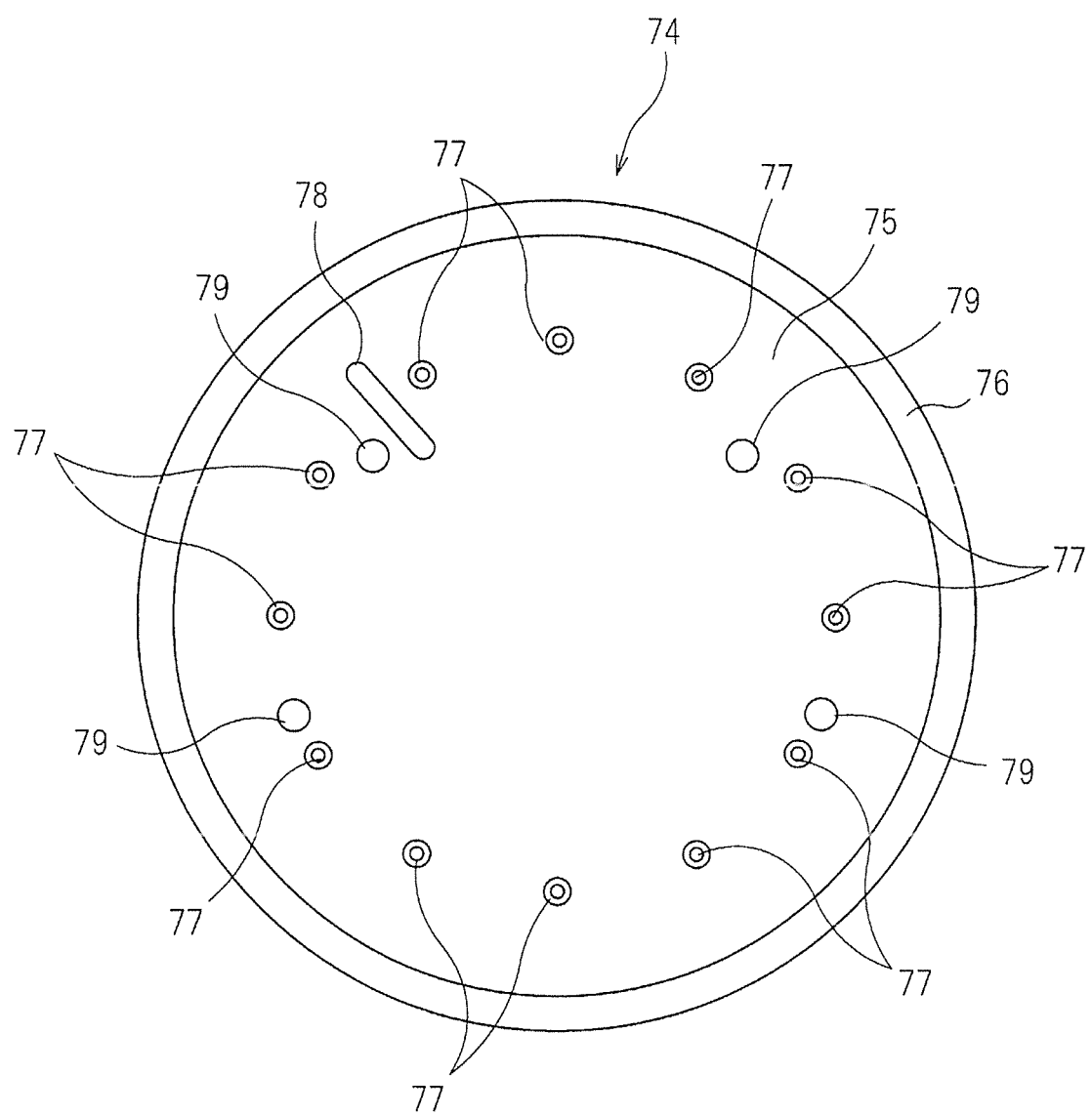
FIG. 5 is a plan view of a susceptor.

The susceptor 74 is supported by the four coupling portions 72 provided on the base ring 71. FIG. 5 is a plan view of the susceptor 74. FIG. 6 is a sectional view of the susceptor 74. The susceptor 74 includes a holding plate 75, a guide ring 76, and a plurality of substrate support pins 77. The holding plate 75 is a substantially circular planar member made of quartz. The diameter of the holding plate 75 is greater than that of the semiconductor wafer W. That is, the holding plate 75 has a plane size greater than that of the semiconductor wafer W.

The guide ring 76 is provided on a peripheral portion of an upper surface of the holding plate 75. The guide ring 76 is an annular ring-shaped member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The plurality of substrate support pins 77 are provided upright on the holding surface 75a of the holding plate 75. In the present preferred embodiment, a total of 12 substrate support pins 77 are provided upright while being spaced at intervals of 30° along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is smaller than the diameter of the semiconductor wafer W, and is 270 mm to 280 mm (in the present preferred embodiment, 280 mm) when the diameter of the semiconductor wafer W is 300 mm. Each of the substrate support pins 77 is made of quartz. The plurality of substrate support pins 77 may be provided by welding on the upper surface of the holding plate 75 or machined integrally with the holding plate 75.

Referring again to FIG. 4, the four coupling portions 72 provided upright on the base ring 71 and the peripheral portion of the holding plate 75 of the susceptor 74 are rigidly secured to each other by welding. That is, the susceptor 74 and the base ring 71 are fixedly coupled to each other with the coupling portions 72. The base ring 71 of such a holder 7 is supported by the wall surface of the process chamber 6, whereby the holder 7 is mounted to the process chamber 6. With the holder 7 mounted to the process chamber 6, the holding plate 75 of the susceptor 74 assumes a horizontal attitude (an attitude such that the normal to the susceptor 74 coincides with a vertical direction). That is, the holding surface 75a of the holding plate 75 becomes a horizontal plane.

A semiconductor wafer W transported into the process chamber 6 is placed and held in a horizontal attitude on the susceptor 74 of the holder 7 mounted to the process chamber 6. At this time, the semiconductor wafer W is supported by the 12 substrate support pins 77 provided upright on the holding plate 75 and is held by the susceptor 74. More strictly speaking, the respective upper ends of the 12 substrate support pins 77 come in contact with the lower surface of the semiconductor wafer W to support the semiconductor wafer W. The semiconductor wafer W can be supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the plurality of substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the plurality of substrate support pins 77.

As shown in FIGS. 4 and 5, an opening 78 is provided in the holding plate 75 of the susceptor 74 so as to extend vertically through the holding plate 75. The opening 78 is provided for the lower radiation thermometer 20 (see FIG. 3) to receive radiation (infrared radiation) emitted from the lower surface of the semiconductor wafer W held by the susceptor 74. That is, the lower radiation thermometer 20 receives light emitted from the lower surface of the semiconductor wafer W held by the susceptor 74 through the opening 78 and the transparent window 21 mounted to the through hole 61b of the chamber side portion 61, and a separately placed detector measures the temperature of the semiconductor wafer W. Further, the holding plate 75 of the susceptor 74 includes four through holes 79 bored therein and designed so that lift pins 12 of the transfer mechanism 10 to be described later pass through the through holes 79, respectively, to transfer the semiconductor wafer W.

Figure 7:
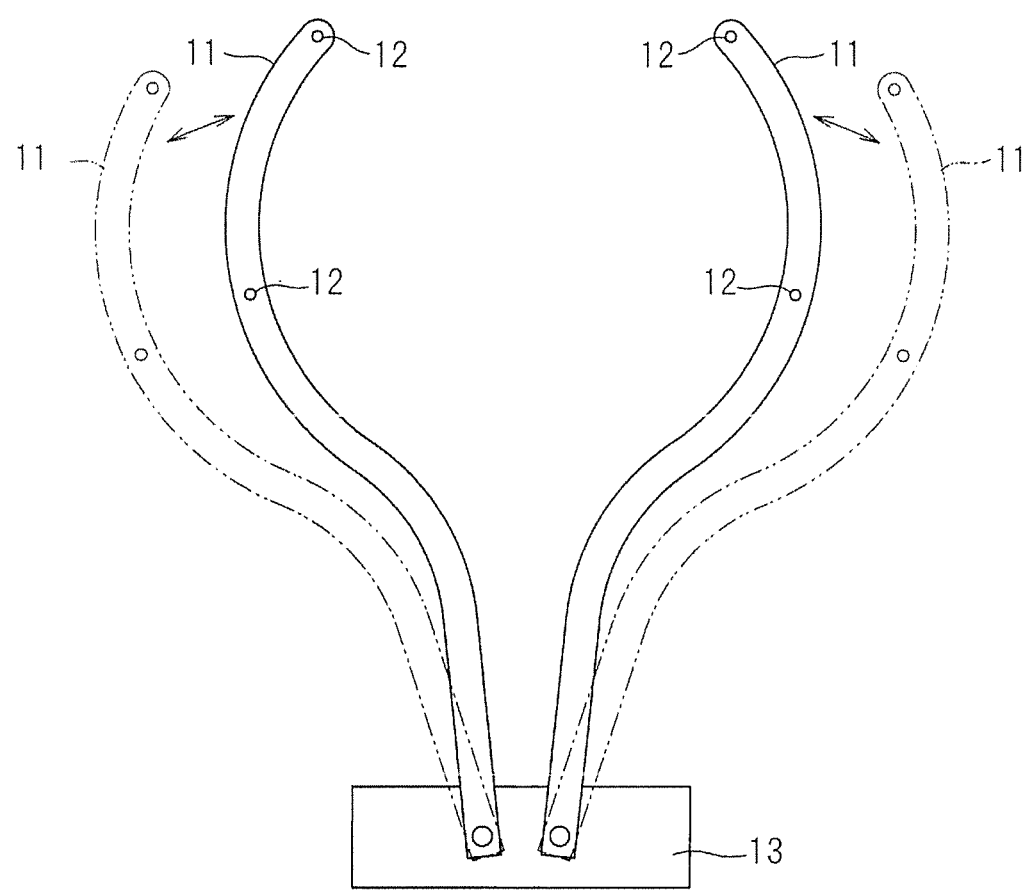
FIG. 7 is a plan view of a transfer mechanism.
Figure 8:
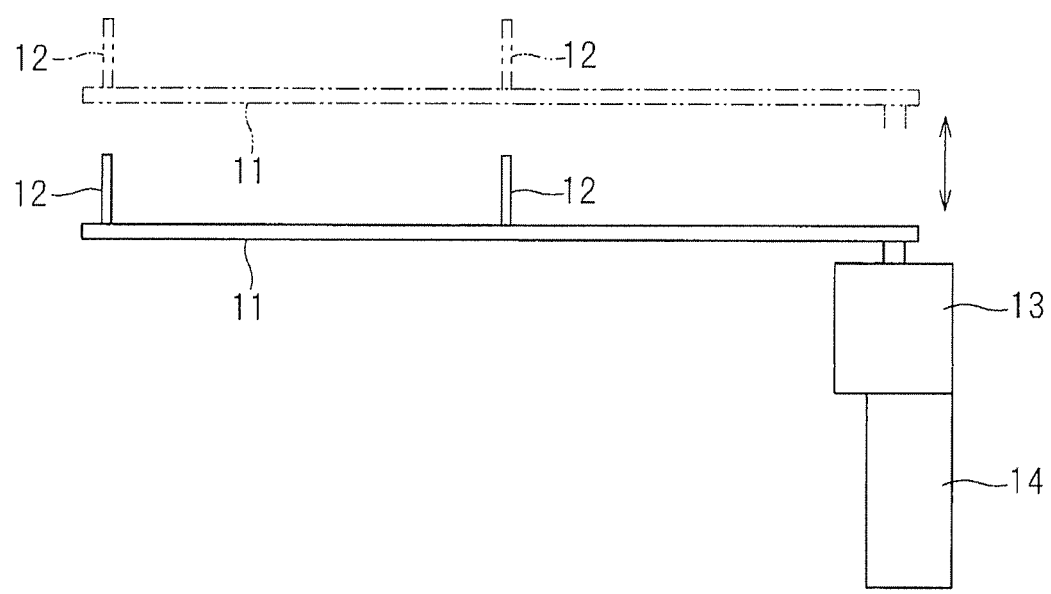
FIG. 8 is a side view of the transfer mechanism.

FIG. 7 is a plan view of the transfer mechanism 10. FIG. 8 is a side view of the transfer mechanism 10. The transfer mechanism 10 includes the two transfer arms 11. The transfer arms 11 are of an arcuate shape extending substantially along the annular ring-shaped recessed portion 62. Each of the transfer arms 11 includes two lift pins 12 provided upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 7) in which the semiconductor wafer W is transferred to and from the holder 7 and a retracted position (a position indicated by dash-double-dot lines in FIG. 7) in which the transfer arms 11 do not overlap the semiconductor wafer W held by the holder 7 in a planar view. The horizontal movement mechanism 13 may be of the type which causes individual motors to pivot the transfer arms 11 respectively or of the type which causes a single motor to pivot the pair of transfer arms 11 in cooperative relation using a linkage mechanism.

The pair of transfer arms 11 is moved up and down together with the horizontal movement mechanism 13 by an elevating mechanism 14. As the elevating mechanism 14 moves up the pair of transfer arms 11 in their transfer operation position, the four lift pins 12 in total pass through the respective through holes 79 (see FIGS. 4 and 5) bored in the susceptor 74 so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the process chamber 6.

Referring again to FIG. 3, outside the chamber side portion 61 of the process chamber 6, the upper radiation thermometer 25 is attached so as to face the through hole 61a formed in the chamber side portion 61 and the lower radiation thermometer 20 is attached so as to face the through hole 61b formed in the chamber side portion 61. That is, the upper radiation thermometer 25 is disposed diagonally above the semiconductor wafer W placed on the susceptor 74 outside the heat treatment space 65, or outside the process chamber 6. The lower radiation thermometer 20 is disposed diagonally below the susceptor 74 outside the heat treatment space 65, or outside the process chamber 6. As described above, the lower radiation thermometer 20 measures the temperature of the lower surface of the semiconductor wafer W through the opening 78 of the susceptor 74 and the transparent window 21 mounted to the through hole 61b of the chamber side portion 61.

On the other hand, the upper radiation thermometer 25 receives infrared radiation emitted from the upper surface of the semiconductor wafer W placed on the susceptor 74 through the transparent window 26 mounted to the through hole 61a of the chamber side portion 61 to measure the temperature of the upper surface of the semiconductor wafer W. The wavelength range of infrared radiation used for the upper radiation thermometer 25 to measure the temperature of the semiconductor wafer W, i.e., the measurement wavelength region of the upper radiation thermometer 25 is 5 μm to 6.5 μm. The upper chamber window 63 made of quartz shields light having a wavelength of 5 μM or longer. Accordingly, light having a wavelength of 5 μm or longer among flashes of light emitted from the flash lamps FL is cut by the upper chamber window 63, and light having a wavelength shorter than 5 μm reaches the heat treatment space 65 in the process chamber 6. The upper chamber window 63 made of quartz functions as a so-called filter, not possibly making flashes of light emitted from the flash lamps FL ambient light for the upper radiation thermometer 25, so that the upper radiation thermometer 25 can receive only infrared radiation emitted from the semiconductor wafer W to measure the temperature of the semiconductor wafer W. The measurement interval of the upper radiation thermometer 25 is, for example, 40 microseconds, so that it is possible to follow an instantaneous temperature change on the upper surface of the semiconductor wafer W during irradiation with flashes of light.

The flash lamp house 5 provided over the process chamber 6 is configured to include an enclosure 51, a light source that is provided inside the enclosure 51 and includes the plurality of (in the present preferred embodiment, 30) xenon flash lamps FL, and a reflector 52 provided inside the enclosure 51 so as to cover the light source from above. The flash lamp house 5 further includes a lamp light radiation window 53 mounted to a bottom of the enclosure 51. The lamp light radiation window 53 forming a floor of the flash lamp house 5 is a plate-shaped quartz window made of quartz. The flash lamp house 5 is provided over the process chamber 6, whereby the lamp light radiation window 53 is opposed to the upper chamber window 63. The flash lamps FL direct flashes of light from over the process chamber 6 through the lamp light radiation window 53 and the upper chamber window 63 toward the heat treatment space 65.

The plurality of flash lamps FL, each of which is a rod-shaped lamp having an elongated cylindrical shape, are arranged in a plane so that the longitudinal directions of the respective flash lamps FL are in parallel with each other along a main surface (i.e., along a horizontal direction) of the semiconductor wafer W held by the holder 7. Thus, a plane defined by the arrangement of the flash lamps FL is also a horizontal plane.

The xenon flash lamps FL each include a rod-shaped glass tube (discharge tube) containing a xenon gas sealed therein and having, on opposite ends thereof, positive and negative electrodes connected to a capacitor, and a trigger electrode attached to an outer peripheral surface of the glass tube. Even if, with the capacitor in a charged state, no electricity flows through the glass tube in a normal state because the xenon gas is electrically insulative. However, when a high voltage is applied to the trigger electrode to produce an electrical breakdown, the electricity stored in the capacitor flows momentarily in the glass tube, so that xenon atoms or molecules are excited at this time to cause light emission. In such xenon flash lamps FL, electrostatic energy preliminarily stored in the capacitor is converted into extremely short optical pulses of 0.1 milliseconds to 100 milliseconds, so that the xenon flash lamps FL have a feature of being capable of emitting much more intense light than the light emitted from a light source such as continuous lighting lamps, i.e., the halogen lamps HL. That is, the flash lamps FL are pulse light emitting lamps that emit light instantaneously in an extremely short time period of less than one second. The light emission time period of the flash lamps FL can be adjusted by the coil constant of a lamp power supply for supplying power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen lamp house 4 provided under the process chamber 6 includes an enclosure 41 and the plurality of (in the present preferred embodiment, 40) built-in halogen lamps HL provided inside the enclosure 41. The plurality of halogen lamps HL direct light from under the process chamber 6 through the lower chamber window 64 toward the heat treatment space 65.

Figure 9:
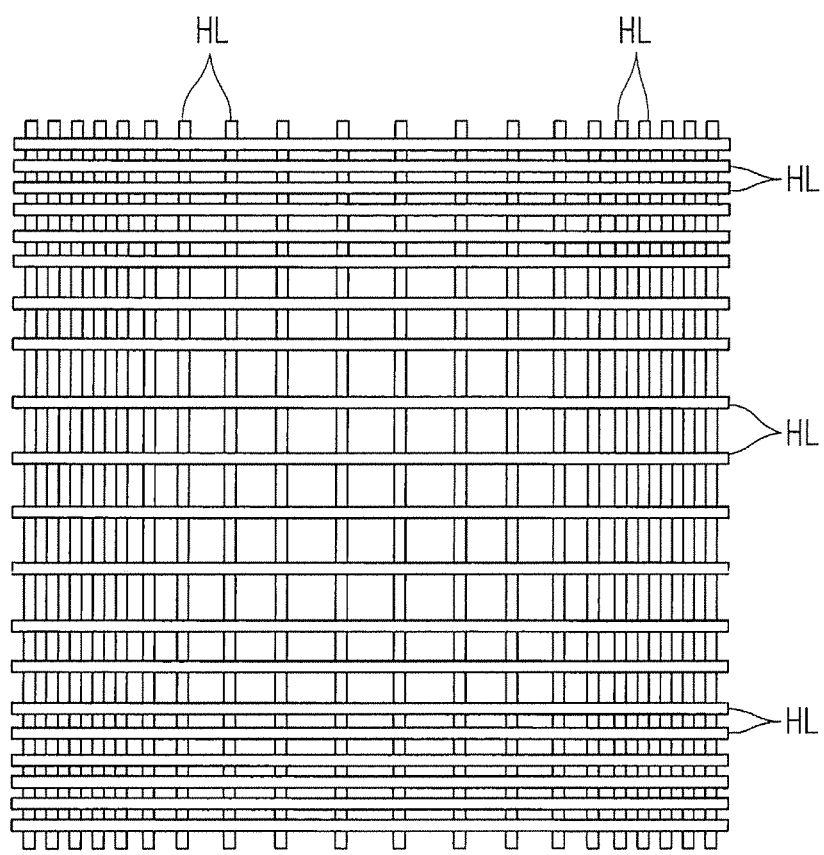
FIG. 9 is a plan view showing an arrangement of a plurality of halogen lamps.

FIG. 9 is a plan view showing an arrangement of the plurality of halogen lamps IR. In the present preferred embodiment, 20 halogen lamps HL are arranged in an upper tier and in a lower tier. Each of the halogen lamps HL is a rod-shaped lamp having an elongated cylindrical shape. The 20 halogen lamps HL in the upper tier and the 20 halogen lamps HL in the lower tier are arranged so that the longitudinal directions thereof are in parallel with each other along a main surface (i.e., along a horizontal direction) of the semiconductor wafer W held by the holder 7. Thus, a plane defined by the arrangement of the halogen lamps HL in each of the upper and lower tiers is a horizontal plane.

As shown in FIG. 9, the halogen lamps HL in each of the upper and lower tiers are disposed at a higher density in a region opposed to a peripheral portion of the semiconductor wafer W held by the holder 7 than in a region opposed to a central portion thereof. That is, the halogen lamps HL in each of the upper and lower tiers are arranged at shorter intervals in a peripheral portion of the lamp arrangement than in a central portion thereof. This allows a greater amount of light to impinge upon the peripheral portion of the semiconductor wafer W where a temperature decrease is prone to occur when the semiconductor wafer W is heated by irradiation with light from the halogen lamps HL.

The group of halogen lamps HL in the upper tier and the group of halogen lamps HL in the lower tier are arranged to intersect each other in a lattice pattern. That is, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine, and the like) in trace amounts into an inert gas such as nitrogen, argon is sealed in the glass tube. The introduction of the halogen element allows the temperature of the filament to be set at a high temperature while suppressing a break in the filament. Thus, the halogen lamps HL have the properties of having a longer life than that of normal incandescent lamps and being capable of continuously emitting intense light. That is, the halogen lamps HL are continuous lighting lamps that emit light continuously for not less than one second. In addition, the halogen lamps HL, which are rod-shaped lamps and thus have a long life, are disposed along a horizontal direction to provide good efficiency of radiation toward the semiconductor wafer W provided over the halogen lamps HL.

Also inside the enclosure 41 of the halogen lamp house 4, a reflector 43 is provided under the halogen lamps HL arranged in the two tiers (FIG. 3). The reflector 43 reflects light emitted from the plurality of halogen lamps HL toward the heat treatment space 65.

The flash heating part 160 further includes, in addition to the aforementioned components, various cooling structures to prevent an excessive temperature rise in the halogen lamp house 4, the flash lamp house 5, and the process chamber 6 because of the heat energy generated from the halogen lamps HL and the flash lamps FL during the heat treatment of the semiconductor wafer W. As an example, a water cooling tube (not shown) is provided in the walls of the process chamber 6. Also, the halogen lamp house 4 and the flash lamp house 5 have an air cooling structure for forming a gas flow therein to exhaust heat. Further, air is supplied to a gap between the upper chamber window 63 and the lamp light radiation window 53 to cool down the flash lamp house 5 and the upper chamber window 63.

The controller 3 controls the aforementioned various operating mechanisms provided in the heat treatment apparatus 100. The controller 3 is similar in hardware configuration to a general computer. That is, the controller 3 includes a CPU that is a circuit for performing various computation processes, a ROM or read-only memory for storing a basic program therein, a RAM or readable/writable memory for storing various pieces of information therein, and a magnetic disk for storing control software, data, and the like therein. The CPU in the controller 3 executes a predetermined processing program, whereby the processes in the heat treatment apparatus 100 proceed. In FIG. 1, the controller 3 is provided in the indexer 101 but is not limited to this example, and the controller 3 can be disposed at any position in the heat treatment apparatus 100.

Next, the heat treatment apparatus 100 according to the present invention will be described in terms of a treatment operation for the semiconductor wafer W. The semiconductor wafer W to be treated is typically a thin plate-shaped substrate (for example, diameter 300 mm, thickness 0.775 mm) obtained by thinly slicing a cylindrical monocrystalline silicon ingot manufactured by, for example, the Czochralski method. Accordingly, the semiconductor wafer W to be treated in the present preferred embodiment is also made of monocrystalline silicon.

Further, the semiconductor wafer W is obtained by slicing the silicon ingot along specific crystal orientation. Generally used are three types of wafers having plane orientations of (100), (110), and (111), and a wafer having a plane orientation of (100) is most used. Also in the present preferred embodiment, the semiconductor wafer W to be treated is a wafer that has a plane orientation of (100) and is made of monocrystalline silicon. An impurity (ion) is added by an ion injection method to the semiconductor wafer W having a plane orientation of (100), and the impurity is activated by a flash light irradiation heat treatment (annealing) of the heat treatment apparatus 100. Treatment procedures of the heat treatment apparatus 100 that is described below proceeds by the controller 3 controlling the operating mechanisms of the heat treatment apparatus 100.

First, in the heat treatment apparatus 100, a plurality of impurity-injected semiconductor wafers W housed in the carrier C are placed in the load port 110 of the indexer 101. Then, the transfer robot 120 extracts the semiconductor wafers W one by one from the carrier C and transports each of the semiconductor wafers W into the alignment chamber 131 of the alignment part 130. When a semiconductor wafer W has been transported into the alignment chamber 131, the gate valve 181 is closed between the alignment chamber 131 and the indexer 101.

The alignment part 130 rotates around a vertical axis the semiconductor wafer W within a horizontal plane, with a central portion of the semiconductor wafer W as a rotational center, and optically detects a notch or the like to adjust the direction of the semiconductor wafer W. Further description will follow for the direction of the semiconductor wafer W to be attained at this time through the rotation and adjustment by the alignment part 130.

Next, the gate valve 183 is opened between the alignment chamber 131 and the transport chamber 170, and the transport robot 150 transports, with the upper transport hand 151a thereof, the semiconductor wafer W whose direction has been adjusted, out of the alignment chamber 131. The transport robot 150 having extracted the semiconductor wafer W pivots so as to be directed to the flash heating part 160. After the semiconductor wafer W is transported out, the gate valve 183 is closed between the alignment chamber 131 and the transport chamber 170.

Subsequently, the gate valve 185 is opened between the process chamber 6 and the transport chamber 170, and the transport robot 150 transports the semiconductor wafer W into the process chamber 6. In the transportation, when a preceding heat-treated semiconductor wafer W is present in the process chamber 6, the lower transport hand 151b extracts the heat-treated semiconductor wafer W and then the upper transport hand 151a transports the untreated semiconductor wafer W into the process chamber 6 to swap the wafers. Then, the gate valve 185 is closed between the process chamber 6 and the transport chamber 170.

The semiconductor wafer W transported into the process chamber 6 is preheated with the halogen lamps HL and then flash-heated by irradiation with flashes of light from the flash lamps FL. This flash heat treatment activates the impurity.

After completion of the flash heat treatment, the gate valve 185 is reopened between the process chamber 6 and the transport chamber 170, and the transport robot 150 transports, with the lower transport hand 151b thereof, the flash-heated semiconductor waver W out of the process chamber 6. The transport robot 150 having extracted the semiconductor wafer W pivots to be directed from the process chamber 6 to the cooler 140. The gate valve 185 is closed between the process chamber 6 and the transport chamber 170, whereas the gate valve 184 is opened between the cooling chamber 141 and the transport chamber 170.

Then, the transport robot 150 advances the lower transport hand 151b thereof to transport the semiconductor wafer W, which has just been flash-heated, into the cooling chamber 141 of the cooler 140. After the flash-heated semiconductor wafer W is transported into the cooling chamber 141, the gate valve 184 is closed between the cooling chamber 141 and the transport chamber 170. The cooler 140 cools the flash-heated semiconductor wafer W. The semiconductor wafer W that has been transported out of the process chamber 6 of the flash heating part 160 has as a whole a relatively high temperature and therefore is to be cooled to the vicinity of ordinary temperature in the cooler 140. After a predetermined cooling time period, the gate valve 182 is opened between the cooling chamber 141 and the indexer 101, and the transfer robot 120 transports the cooled semiconductor wafer W out of the cooling chamber 141 and returns the semiconductor wafer W to the carrier C. When the carrier C receives a predetermined number of treated semiconductor wafers W therein, the carrier C is transported out of the load port 110 of the indexer 101.

The flash heat treatment in the flash heating part 160 will be continuously described. Prior to the transportation of the semiconductor wafer W into the process chamber 6, the valve 84 for feeding a gas is opened and the valves 89 and 192 for exhaust are also opened to start ventilation in the process chamber 6. When the valve 84 is opened, a nitrogen gas is supplied to the heat treatment space 65 through the gas supply opening 81. When the valve 89 is opened, a gas is exhausted from the process chamber 6 through the gas exhaust opening 86. This configuration flows the nitrogen gas, which is supplied from an upper portion of the heat treatment space 65 in the process chamber 6, downward to exhaust the gas from a lower portion of the heat treatment space 65.

Opening the valve 192 allows the gas to be exhausted from the process chamber 6 also through the transport opening 66. Further, the exhaust mechanism not shown also exhausts an atmosphere around the drivers of the transfer mechanism 10. The nitrogen gas is continuously supplied into the heat treatment space 65 while the semiconductor wafer W is heated in the flash heating part 160, and the supply amount of the nitrogen gas is appropriately changed according to a treatment step.

Subsequently, the gate valve 185 is opened to open the transport opening 66. The transport robot 150 transports the semiconductor wafer W to be treated through the transport opening 66 into the heat treatment space 65 in the process chamber 6. The transport robot 150 moves forward the upper transport hand 151a holding the semiconductor wafer W to a position immediately over the holder 7 and stops the upper transport hand 151a thereat. Then, the pair of transfer arms 11 of the transfer mechanism 10 is moved horizontally from the retracted position to the transfer operation position and is then moved up, whereby the lift pins 12 pass through the through holes 79 and protrude from the upper surface of the holding plate 75 of the susceptor 74 to receive the semiconductor wafer W. At this time, the lift pins 12 move up to above the upper ends of the substrate support pins 77.

After the semiconductor wafer W is placed on the lift pins 12, the transport robot 150 moves the upper transport hand 151a out of the heat treatment space 65, and the gate valve 185 closes the transport opening 66. Then, the pair of transfer arms 11 moves down to transfer the semiconductor wafer W from the transfer mechanism 10 to the susceptor 74 of the holder 7, so that the semiconductor wafer W is held in a horizontal attitude from below. The semiconductor wafer W is supported by the plurality of substrate support pins 77 provided upright on the holding plate 75 and is held by the susceptor 74. A predetermined distance is defined between the lower surface of the semiconductor wafer W supported by the plurality of substrate support pins 77 and the holding surface 75a of the holding plate 75. The pair of transfer arms 11 moved down below the susceptor 74 is moved back to the retracted position, i.e. to the inside of the recessed portion 62, by the horizontal movement mechanism 13.

After the semiconductor wafer W is held in a horizontal attitude from below by the susceptor 74 of the holder 7, the 40 halogen lamps HL turn on simultaneously to start preheating (assist heating). Halogen light emitted from the halogen lamps HL is transmitted through the lower chamber window 64 and the susceptor 74 both made of quartz and irradiates the lower surface of the semiconductor wafer W. By receiving light irradiation from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W is measured with the lower radiation thermometer 20 when the halogen lamps HL perform the preheating. That is, the lower radiation thermometer 20 receives through the transparent window 21 infrared radiation emitted from the lower surface of the semiconductor wafer W held by the susceptor 74 through the opening 78 to measure the temperature of the semiconductor wafer W which is on the increase. The measured temperature of the semiconductor wafer W is transmitted to the controller 3. The controller 3 controls the output from the halogen lamps HL while monitoring whether or not the temperature of the semiconductor wafer W which is on the increase by irradiation with light from the halogen lamps HL reaches a predetermined preheating temperature T1. That is, the controller 3 effects feedback control of the output from the halogen lamps HL so that the temperature of the semiconductor wafer W is equal to the preheating temperature T1, on the basis of the value measured with the lower radiation thermometer 20. The preheating temperature T1 is set to about 600° C. to 800° C. that does not possibly cause, by heat, diffusion of the impurity added to the semiconductor wafer W (in the present preferred embodiment, 700° C.).

After the temperature of the semiconductor wafer W reaches the preheating temperature T1, the controller 3 maintains the temperature of the semiconductor wafer W at the preheating temperature T1 for some time. Specifically, when the temperature of the semiconductor wafer W measured with the lower radiation thermometer 20 has reached the preheating temperature T1, the controller 3 adjusts the output from the halogen lamps HL to maintain the temperature of the semiconductor wafer W at approximately the preheating temperature T1.

Such preheating with the halogen lamps HL allows the temperature of the entire semiconductor wafer W to uniformly increase to the preheating temperature T1. In the stage of the preheating using the halogen lamps HL, the semiconductor wafer W shows a tendency to be lower in temperature in a peripheral portion thereof where heat dissipation is liable to occur than in a central portion thereof. However, the halogen lamps HL in the halogen lamp house 4 are arranged at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of the preheating.

After a predetermined time period since the temperature of the semiconductor wafer W has reached the preheating temperature T1, the flash lamps FL irradiate the upper surface of the semiconductor wafer W with flashes of light. In the irradiation, a part of the flashes of light emitted from the flash lamps FL directly travels into the process chamber 6, and another part of the flashes of light is once reflected on the reflector 52 and travels into the process chamber 6, to flash-heat the semiconductor wafer W by irradiation with these flashes of light.

The flash heating is performed by irradiation with flashes of light (glints of light) from the flash lamps FL, so that it is possible to increase the front surface temperature of the semiconductor wafer W in a short time period. That is, the flashes of light emitted from the flash lamps FL are glints of extremely short intense light that is obtained by converting electrostatic energy preliminarily stored in a capacitor into extremely short optical pulses and that has an irradiation time period of 0.1 milliseconds or more and 100 milliseconds or less. The upper surface temperature of the semiconductor wafer W flash-heated by irradiation with flashes of light from the flash lamps FL instantaneously increases to a treatment temperature T2 of 1000° C. or above, and rapidly decreases after the impurity injected into the semiconductor wafer W is activated. Thus, the upper surface temperature of the semiconductor wafer W can be increased and decreased in an extremely short time period, so that the impurity can be activated while the impurity injected into the semiconductor wafer W is prevented from being diffused by heat. It should be noted that the time period necessary for activating an impurity is much shorter than the time period necessary for diffusing the impurity by heat, so that the activation is completed even in a short time period of about 0.1 milliseconds to 100 milliseconds during which no diffusion occurs.

After a predetermined time period since the flash heat treatment has been completed, the halogen lamps HL turn off. The turning off of the halogen lamps HL causes the temperature of the semiconductor wafer W to rapidly decrease from the preheating temperature T1. The lower radiation thermometer 20 measures the temperature of the semiconductor wafer W which is on the decrease. The result of measurement is transmitted to the controller 3. The controller 3 monitors whether or not the temperature of the semiconductor wafer W is decreased to a predetermined temperature, on the basis of the result of measurement with the lower radiation thermometer 20. After the temperature of the semiconductor wafer W is decreased to the predetermined temperature or below, the pair of transfer arms 11 of the transfer mechanism 10 is moved horizontally again from the retracted position to the transfer operation position and is then moved up, whereby the lift pins 12 protrude from the upper surface of the susceptor 74 to receive the heat-treated semiconductor wafer W from the susceptor 74. Next, the transport opening 66 which has been closed is opened by the gate valve 185, and the transport robot 150 transports out, with the lower transport hand 151b thereof, the semiconductor wafer W placed on the lift pins 12. The transport robot 150 moves forward the lower transport hand 151b to a position immediately under the semiconductor wafer W held up by the lift pins 12 and stops the lower transport hand 151b thereat. Subsequently, the pair of transfer arms 11 moves down to transfer the flash-heated semiconductor wafer W to the lower transport hand 151b and place the semiconductor wafer W on the lower transport hand 151b. Then, the transport robot 150 moves the lower transport hand 151b out of the process chamber 6 to transport out the semiconductor wafer W.

In the present preferred embodiment, the upper radiation thermometer 25 is provided outside the heat treatment space 65 of the flash heating part 160, or outside the process chamber 6, and the upper radiation thermometer 25 measures the upper surface temperature of the semiconductor wafer W under a flash heat treatment. During the flash heating of emitting flashes of intense light in an extremely short irradiation time period, an instantaneous temperature difference is generated between the upper surface and the lower surface of the semiconductor wafer W, so that it is important, in terms of process management, to measure the temperature of the upper surface of the semiconductor wafer W on which a device pattern is formed. Hereinafter, description will follow for measurement of the upper surface temperature of the semiconductor wafer W with the upper radiation thermometer 25 during flash heating. The lower radiation thermometer 20 for measuring the temperature of the lower surface of the semiconductor wafer W is mainly used only for temperature control of preheating with the halogen lamps HL.

Figure 10:
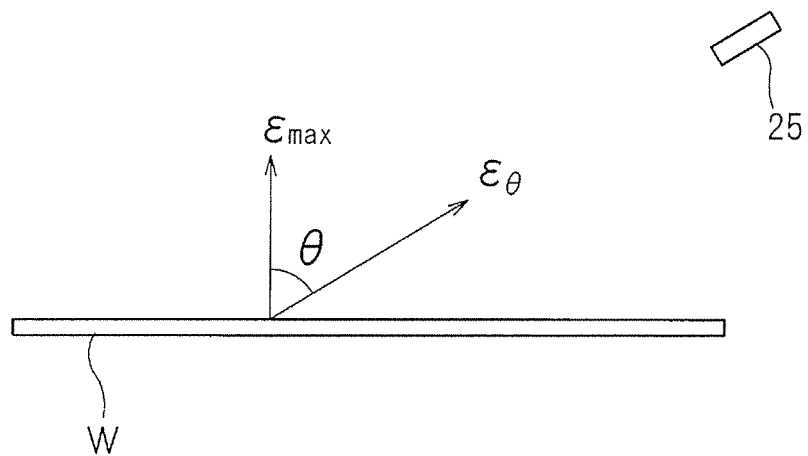
FIG. 10 is a view showing a change in emissivity according to a measurement angle to a semiconductor wafer.

As is known, measuring objects that are even equal in temperature are different in radiant intensity according to the emissivity of the measuring objects, so that the emissivity of a measuring object is necessary for temperature measurement with a radiation thermometer. The emissivity generally changes according to the angle to a measuring object. FIG. 10 is a view showing a change in emissivity according to the measurement angle to the semiconductor wafer W. Typically, the emissivity is a maximum emissivity $\varepsilon_{max}$ in a vertical direction (normal direction) to the upper surface of the semiconductor wafer W, and the emissivity decreases with the decreasing angle to the upper surface. The upper radiation thermometer 25 is disposed diagonally above the semiconductor wafer W placed on the susceptor 74 outside the process chamber 6. With an angle between the normal to the semiconductor wafer W and an optical axis of the upper radiation thermometer 25 defined as θ, an emissivity $\varepsilon_\theta$ is smaller than the maximum emissivity $\varepsilon_{max}$ in the optical axis direction of the upper radiation thermometer 25.

In a heat treatment of the semiconductor wafer W, the emissivity $\varepsilon_\theta$ in the optical axis direction of the upper radiation thermometer 25 is preliminarily acquired and set in the upper radiation thermometer 25. The upper radiation thermometer 25 measures the temperature of the upper surface of the semiconductor wafer W using the emissivity $\varepsilon_\theta$ set.

During the flash heat treatment, however, the upper surface of the semiconductor wafer W is irradiated with flashes of light having high energy in an extremely short irradiation time period, so that the temperature of the upper surface of the semiconductor wafer W instantaneously increases to the treatment temperature T2 of 1000° C. or above, whereas the temperature of the lower surface at that moment does not increase much from the preheating temperature T1. That is, such a situation instantaneously causes a large temperature difference between the upper surface and the lower surface of the semiconductor wafer W. As a result, sudden thermal expansion is generated only on the upper surface of the semiconductor wafer W while the lower surface is hardly thermally expanded, so that the semiconductor wafer W is instantaneously warped to form the upper surface thereof into a protrusion.

FIG. 11 is a view showing a change in emissivity when the semiconductor wafer W is warped. The semiconductor wafer W is warped by irradiation with flashes of light to form the upper surface of the semiconductor wafer W into a protrusion, producing an angle θ+Δθ between the normal to the semiconductor wafer W and the optical axis of the upper radiation thermometer 25. That is, the semiconductor wafer W is warped to change the angle between the normal to the semiconductor wafer W and the optical axis of the upper radiation thermometer 25 by Δθ from when the semiconductor wafer W is flat. Along with this change, the emissivity $\varepsilon_{\theta+\Delta\theta}$ in the optical axis direction of the upper radiation thermometer 25 also changes from the emissivity $\varepsilon_\theta$ when the semiconductor wafer W is flat. Then, the emissivity $\varepsilon_\theta$ set in the upper radiation thermometer 25 is different from the actual emissivity $\varepsilon_{\theta+\Delta\theta}$ to generate an error in temperature measurement.

In order to avoid such an error, the heat treatment technique according to the present invention makes a diameter along a direction in which the warp of the semiconductor wafer W is smallest coincide with the optical axis of the upper radiation thermometer 25 when the flash lamps FL emit flashes of light.

The semiconductor wafer W made of monocrystalline silicon has characteristics of being warped along specific crystal orientation when warped during irradiation with flashes of light. The semiconductor wafer W that has a plane orientation of (100) and is made of silicon is known to be warped along an axis, i.e., a diameter along a <100> direction to form the upper surface of the semiconductor wafer W into a protrusion. That is, the semiconductor wafer W that has a plane orientation of (100) and is made of silicon is warped, with a diameter along the <100> direction uppermost and both sides of the diameter downward, when irradiated with flashes of light.

Here, the semiconductor wafer W that has a plane orientation of (100) and is made of silicon has two diameters along the <100> direction. More accurately, the semiconductor wafer W has two diameters along a [100] direction and a [010] direction. It should be noted that the <100> direction collectively denotes the [100] direction, the direction, and a [001] direction. The semiconductor wafer W that has a plane orientation of (100) and is made of silicon is warped along an axis, i.e., either one of the two diameters along the <100> direction when irradiated with flashes of light. The diameter along the <100> direction that is the axis of the warp is the diameter along the direction in which the warp of the semiconductor wafer W is smallest.

FIG. 12 is a view for illustrating the direction of the semiconductor wafer W placed on the susceptor 74. FIG. 12 shows the diameters along the <100> direction that are indicated by dotted lines. As shown in the same drawing, the semiconductor wafer W having a plane orientation of (100) has two diameters along the <100> direction. These two diameters are orthogonal to each other.

Generally, the semiconductor wafer W having a diameter of 300 mm is provided with a notch 9 that is a cutout portion indicating crystal orientation for adjustment of the direction of the semiconductor wafer W. Usually, the notch 9 is provided on an end of a diameter of the semiconductor wafer W along a <110> direction. An angle is 45° between the diameter that includes the notch 9 and is along the <110> direction and each of the two diameters along the <100> direction. The alignment part 130 optically detects the notch 9 and adjust the semiconductor wafer W so as to direct the semiconductor wafer W to a predetermined direction.

The semiconductor wafer W that has a plane orientation of (100) and is made of monocrystalline silicon is warped along an axis, i.e., either one of the two diameters along the <100> direction when irradiated with flashes of light. A diameter of the two diameters along the <100> direction that is the axis of the warp is the diameter along the direction in which the warp of the semiconductor wafer W is smallest, whereas the other diameter is a diameter along a direction in which the warp is largest. Therefore, when a diameter of the two diameters along the <100> direction that is the axis of the warp coincides with the optical axis of the upper radiation thermometer 25, the semiconductor wafer W is hardly warped in the optical axis direction (Δθ in FIG. 11 is almost 0), so that it is possible to prevent an error in temperature measurement. In contrast, when a diameter of the two diameters along the <100> direction that is orthogonal to the axis of the warp coincides with the optical axis of the upper radiation thermometer 25, the semiconductor wafer W is largely warped in the optical axis direction (Δθ in FIG. 11 becomes the maximum), causing a large error in temperature measurement.

Accordingly, it is important to identify which one of the two diameters along the <100> direction involves as an axis of the warp of the semiconductor wafer W during irradiation with flashes of light. Intrinsically, it is difficult to identify which one of the two equivalent diameters along the <100> direction involves as an axis of the warp of the semiconductor wafer W, on the basis of the characteristics of the semiconductor wafer W made of monocrystalline silicon. The present inventor and the like, however, have ascertained the fact that the semiconductor wafer W is actually warped along an axis, i.e., a diameter along a specific direction on the susceptor 74, the diameter being one of the two diameters along the <100> direction of the semiconductor wafer W placed on the susceptor 74 in the process chamber 6. It is considered that such a phenomenon is caused because slight deviation is generated in an in-plane temperature distribution of the semiconductor wafer W during a heat treatment, and the semiconductor wafer W is, due to the deviation, warped along an axis, i.e., a diameter along a specific direction on the susceptor 74, the diameter being one of the two diameters along the <100> direction of the semiconductor wafer W.

In the first preferred embodiment, as shown in FIG. 12, the alignment part 130 adjusts the direction of the semiconductor wafer W so that a diameter along the <100> direction of the semiconductor wafer W coincides with the optical axis of the upper radiation thermometer 25 when the semiconductor wafer W transported into the process chamber 6 by the transport robot 150 is placed on the susceptor 74 by the transfer mechanism 10. More specifically, the semiconductor wafer W is provided with the notch 9 indicating the <110> direction, and the alignment part 130 adjusts the direction of the semiconductor wafer W on the basis of the position of the notch 9 so that a diameter along the <100> direction coincides with the optical axis of the upper radiation thermometer 25.

The alignment part 130 may adjust the direction of the semiconductor wafer W so that either one of the two diameters along the <100> direction of the semiconductor wafer W coincides with the optical axis of the upper radiation temperature 25. Whichever of the two diameters along the <100> direction of the semiconductor wafer W coincides with the optical axis of the upper radiation thermometer 25, because the semiconductor wafer W is warped along an axis, i.e., a diameter of the two diameters that is along the specific direction on the susceptor 74 during irradiation with flashes of light, the diameter along the specific direction on the susceptor 74 should coincide with the optical axis of the upper radiation thermometer 25. The upper radiation thermometer 25, however, needs to be disposed outside the process chamber 6 so that the specific direction on the susceptor 74, which is along an axis of the warp of the semiconductor wafer W, coincides with the optical axis during irradiation with flashes of light.

In the first preferred embodiment, the alignment part 130 adjusts the direction of the semiconductor wafer W that has a plane orientation of (100) and is made of IS monocrystalline silicon so that a diameter along the <100> direction of the semiconductor wafer W coincides with the optical axis of the upper radiation thermometer 25, and the adjusted semiconductor wafer W is placed on the susceptor 74. This procedure makes a diameter along the direction in which the warp of the semiconductor wafer W is smallest during irradiation with flashes of light coincide with the optical axis of the upper radiation thermometer 25. As a result, even when the semiconductor wafer W is warped by irradiation with flashes of light, the semiconductor wafer W is hardly warped along the optical axis direction of the upper radiation thermometer 25, thus hardly changing the emissivity, so that it is possible to accurately measure the temperature of the upper surface of the semiconductor wafer W.

Second Preferred Embodiment

Next, a second preferred embodiment according to the present invention will be described. The heat treatment apparatus 100 according to the second preferred embodiment is identical in the overall configuration and the configuration of the flash heating part 160 with that according to the first preferred embodiment. The procedure for the treatment of the semiconductor wafer W according to the second preferred embodiment is roughly similar to that according to the first preferred embodiment. The second preferred embodiment differs from the first preferred embodiment in adjustment of the direction of the semiconductor wafer W by the alignment part 130.

Figure 13:
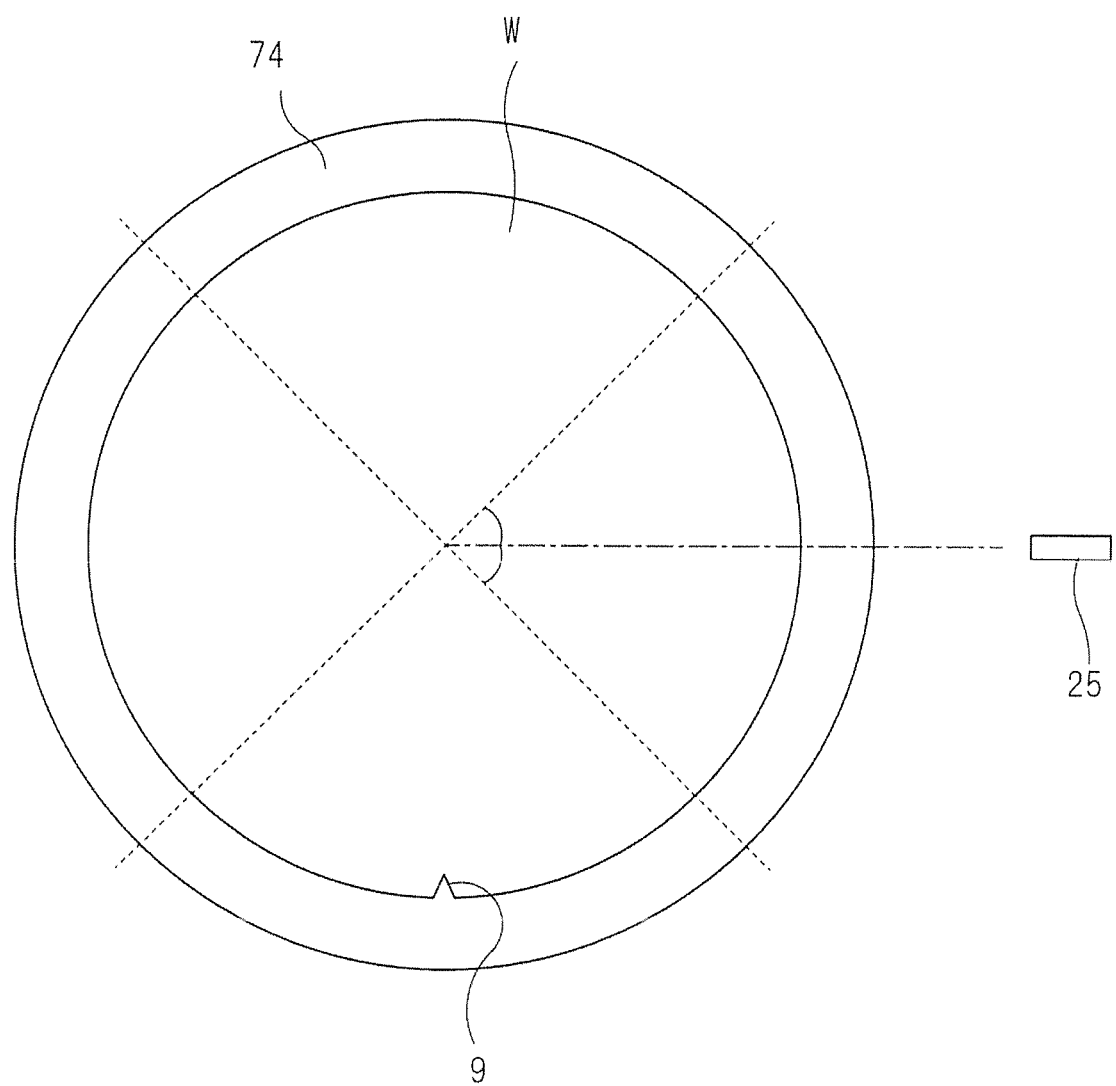
FIG. 13 is a view for illustrating adjustment of the direction of a semiconductor wafer in a second preferred embodiment.

FIG. 13 is a view for illustrating adjustment of the direction of the semiconductor wafer W in the second preferred embodiment. In the first preferred embodiment, the direction of the semiconductor wafer W is adjusted on the basis of the fact that the semiconductor wafer W is, due to deviation in an in-plane temperature distribution of the semiconductor wafer W during a heat treatment, warped along an axis, i.e., a diameter along a specific direction on the susceptor 74, the diameter being one of two diameters along the <100> direction of the semiconductor wafer W. However, when the uniformity is high in the in-plane temperature distribution of the semiconductor wafer W during a heat treatment and deviation is hardly generated in the temperature distribution, it is sometimes impossible to identify which one of the two diameters along the <100> direction of the semiconductor wafer W involves as an axis of the warp of the semiconductor wafer W.

Therefore, in the second preferred embodiment, as shown in FIG. 13, the alignment part 130 adjusts the direction of the semiconductor wafer W so that a bisector of an angle between the two diameters along the <100> direction of the semiconductor wafer W coincides with the optical axis of the upper radiation thermometer 25 when the semiconductor wafer W transported into the process chamber 6 by the transport robot 150 is placed on the susceptor 74 by the transfer mechanism 10. More specifically, the alignment part 130 adjusts the direction of the semiconductor wafer W on the basis of the position of the notch 9 indicating the <110> direction so that a bisector of an angle between the two diameters along the <100> direction of the semiconductor wafer W coincides with the optical axis of the upper radiation thermometer 25.

This adjustment can minimize an error in temperature measurement even when the semiconductor wafer W is warped along an axis, i.e., either one of the two diameters along the <100> direction of the semiconductor wafer W during irradiation with flashes of light, because the warp of the semiconductor wafer W is small in the optical axis direction of the upper radiation thermometer 25. In addition, whichever of the two diameters along the <100> direction of the semiconductor wafer W involves as an axis of the warp of the semiconductor wafer W, the warp of the semiconductor wafer W in the optical axis direction of the upper radiation thermometer 25 is about the same degree in either case, so that it is possible to maintain high reproducibility of temperature measurement.

Third Preferred Embodiment

Next, a third preferred embodiment according to the present invention will be described. The heat treatment apparatus 100 according to the third preferred embodiment is identical in the overall configuration and the configuration of the flash heating part 160 with that according to the first preferred embodiment. The procedure for the treatment of the semiconductor wafer W according to the third preferred embodiment is roughly similar to that according to the first preferred embodiment. The third preferred embodiment differs from the first preferred embodiment in that two upper radiation thermometers, a first upper radiation thermometer 25 and a second upper radiation thermometer 125 are provided outside the process chamber 6.

FIG. 14 is a view for illustrating adjustment of the direction of the semiconductor wafer W in the third preferred embodiment. As described in the second preferred embodiment, when the uniformity is high in an in-plane temperature distribution of the semiconductor wafer W during a heat treatment, it is difficult to identify which one of the two diameters along the <100> direction of the semiconductor wafer W involves as an axis of the warp of the semiconductor wafer W.

In order to solve the difficulty, the two upper radiation thermometers, the first upper radiation thermometer 25 and the second upper radiation thermometer 125 are provided outside the process chamber 6 in the third preferred embodiment. The first upper radiation thermometer 25 is, in the same manner as in the first preferred embodiment, disposed diagonally above the semiconductor wafer W placed on the susceptor 74 outside the process chamber 6. On the other hand, the second upper radiation thermometer 125 is, outside the process chamber 6, provided at a position that is diagonally above the semiconductor wafer W placed on the susceptor 74 and is separated from the first upper radiation thermometer 25 by 90° with the center of the semiconductor wafer W viewed as a vertex. The same thermometer is used for the first and second upper radiation thermometers 25 and 125, both of which receive infrared radiation emitted from the upper surface of the semiconductor wafer W placed on the susceptor 74 to measure the temperature of the upper surface of the semiconductor wafer W.

In the third preferred embodiment, as shown in FIG. 14, the alignment part 130 adjusts the direction of the semiconductor wafer W so that the two diameters along the <100> direction of the semiconductor wafer W coincide with optical axes of the first upper radiation thermometer 25 and the second upper radiation thermometer 125 when the semiconductor wafer W transported into the process chamber 6 by the transport robot 150 is placed on the susceptor 74 by the transfer mechanism 10. More specifically, the alignment part 130 adjusts the direction of the semiconductor wafer W on the basis of the position of the notch 9 indicating the <110> direction so that one of the two diameters along the <100> direction of the semiconductor wafer W coincides with an optical axis of the first upper radiation thermometer 25 and the other diameter coincides with an optical axis of the second upper radiation thermometer 125.

This adjustment makes either one of the optical axes of the first and second upper radiation thermometers 25 and 125 coincide with a diameter along the direction in which the warp of the semiconductor wafer W is smallest, even when the semiconductor wafer W is warped along an axis, i.e., either one of the two diameters along the <100> direction of the semiconductor wafer W during irradiation with flashes of light, so that it is possible to accurately measure the temperature of the upper surface of the semiconductor wafer W.

Naturally, the other optical axis of the first upper radiation thermometer 25 or the second upper radiation thermometer 125 coincides with a diameter along a direction in which the warp of the semiconductor wafer W is largest, causing a large error in temperature measurement. Therefore, an issue is which one of the measurement results of the first and second upper radiation thermometers 25 and 125 is to be used. In the third preferred embodiment, the following method decides which one of the measurement results of the first and second upper radiation thermometers 25 and 125 is to be used.

The present inventor and the like have found that the measurement value of a radiation thermometer, which is disposed diagonally above a semiconductor wafer W and is for measuring the upper surface temperature of the semiconductor wafer W, once slightly decreases at a moment when the semiconductor wafer W starts to be warped during irradiation with flashes of light. The degree of decrease in the measurement value of temperature increases as the warp of the semiconductor wafer W increases. Accordingly, it is possible to determine an optical axis of the optical axes of the first and second upper radiation thermometers 25 and 125 that gives a smaller degree of decrease in the measurement value once decreasing during irradiation with flashes of light, as coinciding with a diameter along the direction in which the warp of the semiconductor wafer W is smallest. Thus, the controller 3 uses one of the first and second upper radiation thermometers 25 and 125 that has a smaller degree of decrease in the measurement value once decreasing during irradiation with flashes of light. With this method, it is possible to accurately measure the temperature of the upper surface of the semiconductor wafer W.

MODIFICATIONS

While the preferred embodiments according to the present invention have been described hereinabove, various modifications of the present invention in addition to those described above may be made without departing from the scope and spirit of the invention. For example, an object to be treated in the aforementioned preferred embodiments is the semiconductor wafer W that has a plane orientation of (100) and is made of monocrystalline silicone. The object to be treated, however, is not limited to this example, and a semiconductor wafer may be heat-treated that has a plane orientation of (110) or (111). Semiconductor wafers having different plane orientations have different directions in which the warp of the semiconductor wafer is smallest during irradiation with flashes of light. Therefore, it is useful to register in a table the directions in which the warp is smallest during irradiation with flashes of light, according to the plane orientation. Then, the alignment part 130 under control of the controller 3 adjusts the direction of the semiconductor wafer W so that a diameter along the direction in which the warp of the semiconductor wafer W is smallest during irradiation with flashes of light coincides with the optical axis of the upper radiation thermometer 25. This adjustment makes the semiconductor wafer W hardly warped in the optical axis direction of the upper radiation thermometer 25, thus hardly changing the emissivity, even when the semiconductor wafer W is warped by irradiation with flashes of light, so that it is possible to accurately measure the temperature of the upper surface of the semiconductor wafer W.

In the first preferred embodiment, the direction of the semiconductor wafer W is adjusted on the basis of the fact that the semiconductor wafer W is, during a heat treatment, warped along an axis, i.e., a diameter along the specific direction on the susceptor 74, the diameter being one of two diameters along the <100> direction of the semiconductor wafer W. The specific direction on the susceptor 74 sometimes changes with a variation of deviation in a temperature distribution when the susceptor 74 or the like is replaced. Therefore, when the susceptor 74 or the like is replaced for, for example, maintenance, it is preferable to perform reverification to identify which one of the two diameters along the <100> direction of the semiconductor wafer W involves as an axis of the warp of the semiconductor wafer W and along which direction on the susceptor 74 the diameter is.

The semiconductor wafer W in the aforementioned preferred embodiments is provided with the notch 9 for adjusting the direction of the semiconductor wafer W. The semiconductor wafer W, however, may be provided with an orientation flat in place of the notch 9.

In the aforementioned preferred embodiments, the semiconductor wafer W is preheated by irradiation with light from the halogen lamps HL. In place of the halogen lamps HL, the semiconductor wafer W may be preheated by heat conduction from a hot plate on which is placed the susceptor holding the semiconductor wafer W.

In the aforementioned preferred embodiments, the flash lamp house 5 includes 30 flash lamps FL. The number of flash lamps FL, however, is not limited to 30 and can be any number. Further, the flash lamps FL are not limited to xenon flash lamps but may be krypton flash lamps. Furthermore, the number of halogen lamps HL included in the halogen lamp house 4 is not limited to 40 but can be any number.

In the aforementioned preferred embodiments, the semiconductor wafer W is preheated using filament halogen lamps HL as continuous lighting lamps that emit light continuously for not less than one second. The continuous lighting lamps, however, are not limited to the filament halogen lamps HL, and the semiconductor wafer W may be preheated using, in place of the halogen lamps HL, arc lamps (e.g., discharge xenon arc lamps) as the continuous lighting lamps.

While the invention has been shown and described in detail, the foregoing description is in all aspects illustrative and not restrictive. It is therefore understood that numerous modifications and variations can be devised without departing from the scope of the invention.

What is claimed is:

1. A heat treatment apparatus for irradiating a disk-shaped substrate with a flash of light to heat the substrate, said heat treatment apparatus comprising:
   an alignment mechanism for adjusting a direction of a substrate;
   a chamber for receiving said substrate therein and heat-treating said substrate;
   a susceptor which is disposed in said chamber and on which said substrate is placed and held;
   a transport part for transporting said substrate from said alignment mechanism to said susceptor in said chamber;
   a flash lamp that is provided over said chamber and irradiates with a flash of light an upper surface of said substrate placed on said susceptor; and
   a radiation thermometer that is disposed diagonally above said substrate placed on said susceptor and receives infrared radiation emitted from an upper surface of said substrate to measure a temperature of the upper surface,
   said alignment mechanism adjusting the direction of said substrate so that a diameter along a direction in which a warp of said substrate is smallest coincides with an optical axis of said radiation thermometer when said flash lamp emits a flash of light.

2. The heat treatment apparatus according to claim 1, wherein
   said substrate is a semiconductor wafer that has a plane orientation of (100) and is made of monocrystalline silicon, and
   said alignment mechanism adjusts the direction of said substrate so that a diameter along a <100> direction of said substrate coincides with the optical axis of said radiation thermometer.

3. A heat treatment apparatus for irradiating a disk-shaped substrate with a flash of light to heat the substrate, said heat treatment apparatus comprising:
   an alignment mechanism for adjusting a direction of a substrate;
   a chamber for receiving said substrate therein and heat-treating said substrate;
   a susceptor which is disposed in said chamber and on which said substrate is placed and held;
   a transport part for transporting said substrate from said alignment mechanism to said susceptor in said chamber;
   a flash lamp that is provided over said chamber and irradiates with a flash of light an upper surface of said substrate placed on said susceptor; and
   a radiation thermometer that is disposed diagonally above said substrate placed on said susceptor and receives infrared radiation emitted from an upper surface of said substrate to measure a temperature of the upper surface, said substrate being a semiconductor wafer that has a plane orientation of (100) and is made of monocrystalline silicon, and said alignment mechanism adjusting the direction of said substrate so that a bisector of an angle between two diameters along a <100> direction of said substrate coincides with an optical axis of said radiation thermometer.

4. A heat treatment apparatus for irradiating a disk-shaped substrate with a flash of light to heat the substrate, said heat treatment apparatus comprising:

an alignment mechanism for adjusting a direction of a substrate;

a chamber for receiving said substrate therein and heat-treating said substrate;

a susceptor which is disposed in said chamber and on which said substrate is placed and held;

a transport part for transporting said substrate from said alignment mechanism to said susceptor in said chamber;

a flash lamp that is provided over said chamber and irradiates with a flash of light an upper surface of said substrate placed on said susceptor;

a first radiation thermometer that is disposed diagonally above said substrate placed on said susceptor and receives infrared radiation emitted from an upper surface of said substrate to measure a temperature of the upper surface; and a second radiation thermometer that is disposed diagonally above said substrate and separated from said first radiation thermometer by 90° with a center of said substrate viewed as a vertex and that receives infrared radiation emitted from an upper surface of said substrate to measure a temperature of the upper surface, said substrate being a semiconductor wafer having a plane orientation of (100) and is made of monocrystalline silicon, and said alignment mechanism adjusting the direction of said substrate so that two diameters along a <100> direction of said substrate coincide with optical axes of said first radiation thermometer and said second radiation thermometer.

* * * * *